US011531052B2

(12) United States Patent
Auzanneau

(10) Patent No.: US 11,531,052 B2
(45) Date of Patent: Dec. 20, 2022

(54) BINARY REFLECTOMETRY SYSTEM FOR ANALYZING FAULTS IN A TRANSMISSION LINE

(71) Applicant: COMMISSARIAT A L'ENERGIE ATOMIQUE ET AUX ENERGIES ALTERNATIVES, Paris (FR)

(72) Inventor: Fabrice Auzanneau, Massy (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 46 days.

(21) Appl. No.: 17/055,975

(22) PCT Filed: May 20, 2019

(86) PCT No.: PCT/EP2019/062919
§ 371 (c)(1),
(2) Date: Nov. 16, 2020

(87) PCT Pub. No.: WO2019/224137
PCT Pub. Date: Nov. 28, 2019

(65) Prior Publication Data
US 2021/0255230 A1  Aug. 19, 2021

(30) Foreign Application Priority Data

May 23, 2018  (FR) ...................................... 1854285
Jul. 20, 2018  (FR) ...................................... 1856741

(51) Int. Cl.
*G01R 31/11*  (2006.01)
(52) U.S. Cl.
CPC .................................... *G01R 31/11* (2013.01)
(58) Field of Classification Search
CPC ........ G01R 31/11; G01R 31/28; G01R 31/08; G01R 29/085; G01R 31/2836
See application file for complete search history.

(56) References Cited

U.S. PATENT DOCUMENTS 5,425,017 A * 6/1995 Copley ................. H04L 12/433
370/245
6,795,496 B1 * 9/2004 Soma ..................... G01R 29/26
702/69

(Continued)

FOREIGN PATENT DOCUMENTS

| EP | 0 623 827 A2 | 11/1994 |
| FR | 3 060 129 A1 | 6/2018 |
| WO | 2014/023699 A1 | 2/2014 |
| WO | 2016/192980 A1 | 12/2016 |

OTHER PUBLICATIONS

Smith, "Chapter 3: ADC and DAC", The Scientist and Engineer's Guide to Digital Signal Processing, pp. 35-66, XP-002788051, Dec. 31, 1997.

(Continued)

*Primary Examiner* — Son T Le
(74) *Attorney, Agent, or Firm* — BakerHostetler

(57) ABSTRACT

A reflectometry system for analyzing faults in a transmission line, a reference signal being generated, in an initial step, and injected in the transmission line, the system includes a device (CPL) for acquiring the analog signal back-propagated in the transmission line, an equalization circuit (EGA) configured for equalizing the amplitudes obtained on the reflectogram for the peaks of the injected signal after its point of injection into the transmission line and of the signal reflected on the end of the transmission line, a binarization device (B) for converting the back-propagated analog signal into a signal digitized over two quantization levels, a correlator (COR) configured for correlating the digitized signal with the reference signal in order to produce a time-domain reflectogram, a module for analyzing the time-domain reflectogram in order to identify the presence of faults in the transmission line.

16 Claims, 19 Drawing Sheets

(56) References Cited

U.S. PATENT DOCUMENTS

| | | | |
|---|---|---|---|
| 8,280,655 B2* | 10/2012 | Foran | G01R 21/133 |
| | | | 702/60 |
| 2002/0161542 A1 | 10/2002 | Jones et al. | |
| 2006/0061368 A1 | 3/2006 | Furse et al. | |
| 2013/0106399 A1* | 5/2013 | Gohel | G01R 35/005 |
| | | | 324/76.77 |
| 2016/0276820 A1* | 9/2016 | Olivas | H02H 1/003 |

OTHER PUBLICATIONS

Taylor, et al., "Digital simulation of fault location on EHV lines using wideband spread spectrum techniques", IEE Proc.-Gener. Transm. Distrib., vol. 142, No. 1, pp. 73-80, Jan. 1995.

Taylor, et al., "Line monitoring and fault location using spread spectrum on power line carrier", IEE Proc.-Gener. Transm. Distrib., vol. 143, No. 5, pp. 427-434, Sep. 1996.

Smith, et al., "Analysis of spread spectrum time domain reflectometry for wire fault location", IEEE Sensors Journal, vol. 5, Issue: 6, pp. 1469-1478, 2005.

LeLong, et al., "On line wire diagnosis using Multicarrier Time Domain Reflectometry for fault location", IEEE Sensors Conference, pp. 751-754, 2009.

Ben Hassen, et al., "OMTDR using BER estimation for ambiguities cancellation in ramified networks diagnosis", 2013 IEEE Eighth International Conference on Intelligent Sensors, Sensor Networks and Information Processing.

Auzanneau, et al., "Chaos Time Domain Reflectometry for Online Defect Detection in Noisy Wired Networks", IEEE Sensors Journal, vol. 6, Issue: 22, pp. 8027-8034, 2016.

Smith, "The scientist and engineer's guide to digital signal processing; Chapter 3: ADC and DAC", pp. 35-66, Dec. 31, 1997.

* cited by examiner

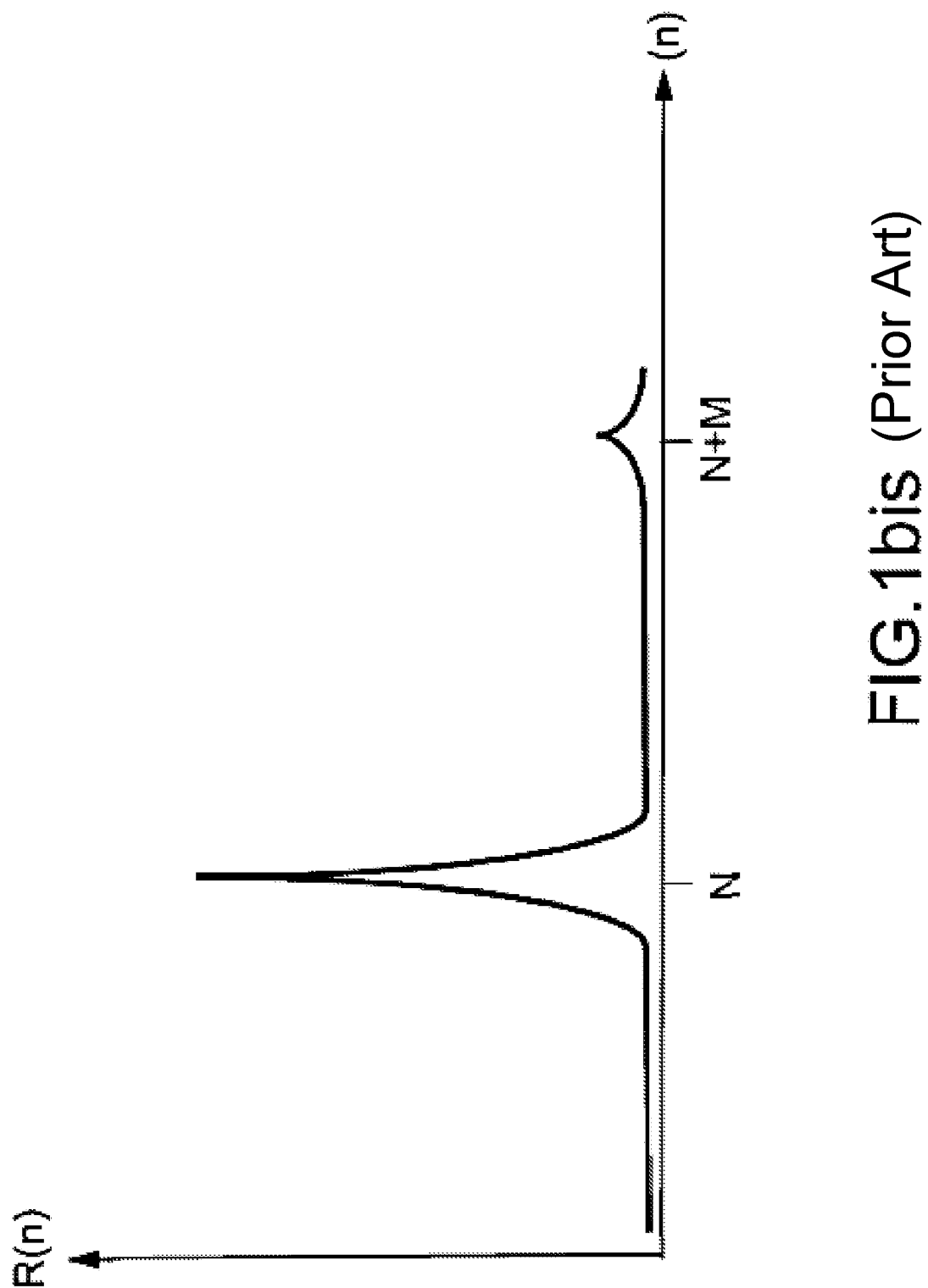
FIG.1bis (Prior Art)

BINARY REFLECTOMETRY SYSTEM FOR ANALYZING FAULTS IN A TRANSMISSION LINE

CROSS-REFERENCE TO RELATED APPLICATIONS

This application is a National Stage of International patent application PCT/EP2019/062919, filed on May 20, 2019, which claims priority to foreign French patent application No. FR 1854285, filed on May 23, 2018, and French patent application No. 1856741 filed on Jul. 20, 2018, the disclosures of which are incorporated by reference in their entireties.

FIELD OF THE INVENTION

The invention relates to the field of the analysis of faults affecting transmission lines, such as electrical cables.

More precisely, the invention relates to the particular field of reflectometry applied to wired-connection diagnostics which encompasses the field of the detection, the localization and the characterization of faults in single transmission lines or complex wired networks.

The invention relates to a reflectometry system using binary or binarized signals allowing the complexity of implementation of such a system to be significantly reduced both through the reduction in the calculations and in the size of the memory used and the increase in the speed of execution.

BACKGROUND

The known reflectometry methods operate according to the following procedure. A well-defined reference signal, for example a pulse signal or else a multi-carrier signal, is injected at one end of the cable to be tested. More generally, in the modern reflectometry methods, the reference signal used is chosen according to its intercorrelation properties. The signal propagates along the cable and is reflected on the singularities that it comprises.

A singularity in a cable corresponds to a modification of the conditions of propagation of the signal in this cable. It most often results from a fault or defect which locally modifies the characteristic impedance of the cable by causing a discontinuity in its linear electrical parameters.

The reflected signal is back-propagated up to the point of injection, then is analyzed by the reflectometry system. The delay between the injected signal and the reflected signal allows a singularity (or several singularities) to be localized, corresponding to an electrical fault in the cable. A fault may result from a short-circuit, from an open circuit or else a local degradation of the cable or even a simple pinch point on the cable.

The signals used by reflectometry systems are usually generated by a programmable digital system of the processor or integrated circuit or FPGA circuit type and transformed into analog signals prior to being injected into the cable to be analyzed. Similarly, the measured signals, analog by nature, are converted into digital signals in order to be processed, in particular to be correlated with the reference signal.

In order to enable the accurate detection, in the calculated reflectogram, of low amplitude peaks corresponding to minor faults, also referred to as soft faults, it is generally necessary to digitize the measured signals, after their propagation in the cable, over a large number of bits in order to guarantee a high level of precision for the result of the intercorrelation calculation.

The conversion of the signals from the digital domain to the analog domain, and vice versa, requires the use of converters which are complex, costly components, whose performance is limited, with a view to being integrated into portable on-board systems.

There accordingly exists a need to design a reflectometry system allowing an accurate detection and localization of faults with a significantly less complex architecture than the existing systems in terms of number of operations to be carried out and of memory space required.

The pioneering studies in the application of reflectometry to cable diagnostics were made by Faulkner and Taylor from Victoria University of Technology, Melbourne, circa 1995, followed by those of the University of Utah, around 2002. This university has developed methods of frequency-domain reflectometry FDR and of time-domain reflectometry TDR, together with systems capable of implementing them.

The reflectometry methods based on spread spectrum techniques are the highest performance techniques but at the expense of the use of complex signals (which exhibit an autocorrelation function in the form of a peak) and of an intercorrelation calculation between the measured signal and the injected signal.

Each method uses a different reference signal with a general common objective of obtaining good autocorrelation properties.

Amongst these methods, the methods of the STDR (Sequence Time Domain Reflectometry) and SSTDR (Spread Spectrum Time Domain Reflectometry) type described in [1] may be mentioned. The STDR method uses a pseudo-random binary signal. The SSTDR method combines this pseudo-random signal with a carrier frequency in order to shift the spectrum of the signal around this carrier frequency, which allows an onboard and on-line use.

The MCTDR (Multi Carrier Time Domain Reflectometry) method described in the document [2] is also known. This method uses a multi-carrier signal, in other words formed of weighted sums of pure frequencies.

The OMTDR (Orthogonal Multitone Time Domain Reflectometry) method is also known, which uses a signal with mutually-orthogonal multi-carriers, inspired by the OFDM (Orthogonal Frequency Division Multiplexing) digital transmission methods. This method is described in the document [3]. These two methods also allow an onboard and on-line use, by virtue of the control of the spectrum of the signal used.

Lastly, the CTDR (Chaos Time Domain Reflectometry) method is also known, which uses a chaotic pseudo-random analog signal. This method is described in [4].

All these methods give results that are advantageous for the detection and the localization of faults in wired networks, each having its advantages or priority fields of use. The STDR method is aimed at an external use. The SSTDR—MCTDR and OMTDR methods are aimed at on-line diagnostics. The OMTDR method allows the communication of several reflectometry systems during the diagnosis in order to improve the result by merging of sensors. The CTDR method is well adapted to soft faults and to intermittent faults.

However, all these methods are implemented in the same way. An electronic system generates the values of the injected signal at each time marked by a clock. This system is most often a programmable digital system such as a processor or an FPGA. The digital signal is subsequently converted into an analog signal by a digital analog converter in order to be injected into the cable. The signal re-emitted by the cable is directed toward an analog-digital converter which transmits digital values to the processing system for it to calculate the intercorrelation between the measured signal and the injected signal.

The current solutions are not satisfactory because the use of digital-analog and analog-digital converters adds significant complexity, both from the point of view of the electronic design (on a board or integrated circuit) and from that of the implementation via the required memory. Furthermore, the impact on the performance is significant since the converters limit the frequency band of the signals and hence the precision of localization of faults.

A digital-analog converter has two parameters which have a significant influence on the performance of the reflectometry system: i.e. the resolution and the sampling frequency. The resolution corresponds to the number of bits over which each signal sample is coded. It has a particular influence on the precision of the intercorrelation operation. A low resolution may prevent the detection, in a reflectogram, of low amplitude peaks corresponding to soft faults. The sampling frequency has an influence on the precision of localization of the faults. A high sampling frequency allows the high-frequency components of the signal to be converted, which allow faults to be more precisely localized. Furthermore, a high sampling frequency allows the width of the amplitude peaks in a reflectogram to be reduced and thus to be discriminated from the neighboring peaks. The complexity, and hence the cost, of a digital-analog converter increases with its resolution and its sampling frequency.

In the same way, the complexity and the cost of an analog-digital converter also increases with its performance in terms of sampling frequency and of resolution. Furthermore, an analog-digital converter with a high sampling frequency generates a very large quantity of samples which must be stored in memory in order to be processed by the correlator. Thus, a large memory space is most often needed.

There accordingly exists a need to develop a reflectometry system which allows an accurate detection and localization of faults but involving a reduced complexity in terms of number of operations to be carried out and of memory space required.

SUMMARY OF THE INVENTION

The invention aims to solve the limitations of the current solutions by providing a binary reflectometry system which does not require either analog-digital or digital-analog converters.

The subject of the invention is a reflectometry system for analyzing faults in a transmission line, a reference signal being generated, in an initial step, and injected into the transmission line, the system comprising:
  A device for measuring or acquiring said analog signal back-propagated in the transmission line,
  A binarization device for quantizing said back-propagated analog signal into a signal digitized over two quantization levels,
  A correlator configured for correlating the digitized signal with the reference signal in order to produce a time-domain reflectogram,
  A module for analyzing the time-domain reflectogram in order to identify the presence of faults in the transmission line.

According to one particular aspect of the invention, the binarization device is a logic circuit of the flip-flop or comparator type.

According to one particular variant, the reflectometry system according to the invention comprises:
  a generator of a binarized reference signal,
  an injection device for injecting the binarized reference signal into the transmission line.

According to one particular aspect of the invention, the generator and the injection device are implemented in the form of a programmable digital circuit having at least one digital output pin designed to be connected to the transmission line.

According to one particular variant the reflectometry system according to the invention comprises a device for matching the impedance of the digital output pin to the impedance of the transmission line or of the track of the printed circuit to which it is connected.

According to one particular variant, the reflectometry system according to the invention furthermore comprises at least one equalizer disposed between the acquisition device and a point of connection between said system and the transmission line, each equalizer being configured for equalizing the amplitudes obtained on the time-domain reflectogram for the peaks of the injected signal at the point of injection into the transmission line and of the signal reflected on the end of the transmission line.

According to one particular variant of the invention, each equalizer is formed by a voltage divider bridge comprising at least one resistor $R_P$.

According to one particular variant of the invention, each equalizer comprises two resistors $R_S$, $R_P$ arranged as a resistor bridge.

According to one particular variant of the invention, the values of the resistor $R_P$ or of the resistors $R_S$, $R_P$ are determined based on a set of impedances characterizing said system and the transmission line.

According to one particular variant of the invention, the reference signal is a binarized pseudo-random signal.

According to one particular variant of the invention, the correlator comprises at least one logic circuit implementing an Exclusive NOR logic gate.

According to one particular variant of the invention, the correlator comprises a counter arranged for counting the number of values at 1 at the output of the Exclusive NOR logic gate, the correlator being configured for calculating the intercorrelation between the digitized signal and the reference signal based on this number.

According to one particular variant of the invention, the correlator comprises several Exclusive NOR logic gates each arranged for receiving on their inputs a sample of the digitized signal and a sample of the reference signal, a summer for summing the outputs of the Exclusive NOR logic gates, a shifter or a multiplier for multiplying the output of the summer by two and an adder for adding a predetermined number to the result from the summer.

According to one particular variant of the invention, the correlator comprises at least one logic circuit implementing an Exclusive OR logic gate.

According to one particular variant of the invention, the correlator is configured for incrementally calculating a time-domain reflectogram by means of the following steps:
  receive, at a current time i+dK, a measurement of the signal after its propagation in the transmission line, said measurement comprising a number dK of samples,
  determine a reflectogram $R_{i+dK}$ at the current time i+dK, starting from a preceding reflectogram $R_i$ calculated at a preceding time i, by carrying out the following operations for each value of the reflectogram:

add to the preceding reflectogram $R_i$, the sum of the Exclusive OR operations between a number dK of samples of the signals measured at the preceding time i and a number dK of corresponding samples of the reference signals injected into the transmission line at an injection time i'–dK, add to the preceding reflectogram $R_i$, the sum of the Exclusive NOR operations between a number dK of samples measured at the current time i+dK and a number dK of corresponding samples of the reference signals injected into the transmission line at an injection time i'.

According to one particular variant of the invention, the correlator comprises a first shift register for receiving the reference signal, the first shift register being respectively connected to a first input of the Exclusive OR logic gate and to a first input of the Exclusive NOR logic gate, a second shift register for receiving the digitized signal, the second shift register being respectively connected to a second input of the Exclusive OR logic gate and to a second input of the Exclusive NOR logic gate, a register for saving the results of the calculation of a time-domain reflectogram, a first adder arranged for adding to a current value R(i) of the time-domain reflectogram, a result produced at the output of the Exclusive OR logic gate and a second adder arranged for adding to a current value R(i) of the time-domain reflectogram, a result produced at the output of the Exclusive NOR logic gate.

According to one particular variant, the reflectometry system according to the invention furthermore comprises a white noise generator disposed between the acquisition device and the binarization device.

According to one particular variant, the reflectometry system according to the invention furthermore comprises a time-derivative or differentiation device disposed upstream of the binarization device.

According to one particular variant, the reflectometry system according to the invention furthermore comprises a digital time derivative or differentiation device applied to the reference signal before its correlation with the digitized signal.

BRIEF DESCRIPTION OF THE DRAWINGS

Other features and advantages of the present invention will become more clearly apparent upon reading the description that follows in relation with the appended drawings, which show:

FIG. 1bis, one example of a reflectogram obtained with the reflectometry system in FIG. 1, FIG. 2, a diagram of a reflectometry system according to a first embodiment of the invention, FIG. 3, two diagrams illustrating a quantization operation for a digital signal, FIG. 4, two diagrams illustrating a reflectogram respectively obtained with a reflectometry system of the prior art and a reflectometry system according to the first embodiment of the invention, FIG. 5, a diagram of a correlator according to a first variant embodiment of the invention, FIG. 6, a flow diagram detailing the steps for implementing an optimized method for calculating a reflectogram, FIG. 7, a diagram illustrating a comparison of the injected signal at a point of a cable and of the signal measured at a point of a cable at two successive times, FIG. 8, a diagram of a correlator according to a second variant embodiment of the invention, FIG. 9, a diagram of a reflectometry system according to a second embodiment of the invention, FIG. 10, two diagrams illustrating a reflectogram obtained respectively with a reflectometry system of the prior art and a reflectometry system according to the second embodiment of the invention, FIG. 11, a diagram of a reflectometry system according to a third embodiment of the invention, FIG. 12, a diagram of one example of a differentiating circuit, FIG. 13, two diagrams illustrating a reflectogram respectively obtained with a reflectometry system of the prior art and a reflectometry system according to the third embodiment of the invention, FIG. 14, two time-domain reflectograms illustrating a problem solved by a fourth embodiment of the invention, FIG. 15, a diagram of a reflectometry system according to a fourth embodiment of the invention, FIG. 16, a diagram of one example of an equalizer device, FIG. 17, a diagram illustrating the determination of the values of the resistors of an equalizer device according to a variant of the fourth embodiment of the invention, FIG. 18, two time-domain reflectograms illustrating the results obtained by virtue of the fourth embodiment of the invention.

DETAILED DESCRIPTION

Figure 1:
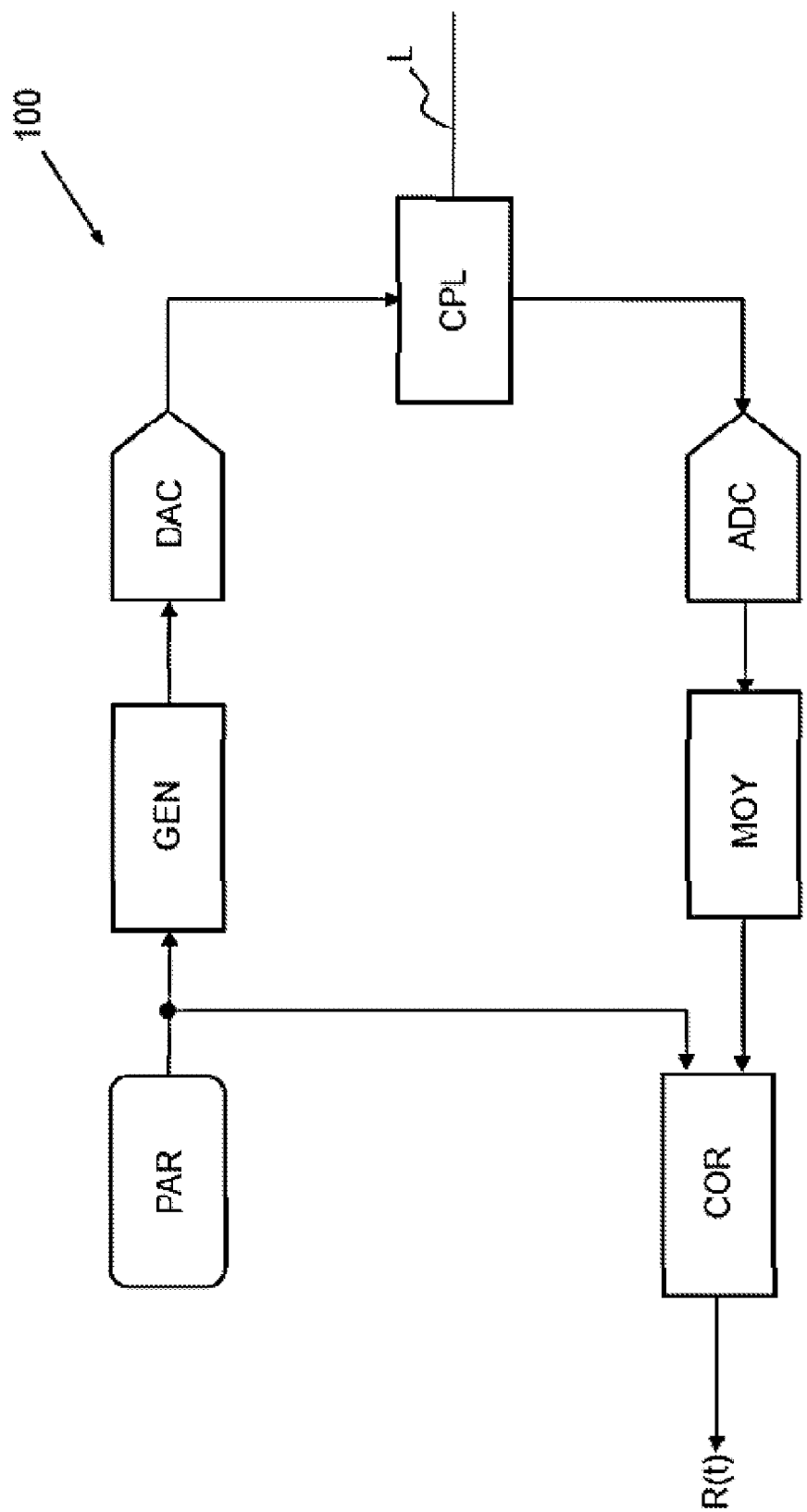
FIG. 1, a diagram of a reflectometry system according to the prior art.

FIG. 1 shows a diagram of a system 100 for analyzing faults in a transmission line L, such as a cable, according to a usual method of time-domain reflectometry of the prior art. Such a system principally comprises a generator GEN of a reference digital signal. The reference digital signal generated is converted into analog via a digital-analog converter DAC, then is injected into a point of the transmission line L by means of a directional coupler CPL or any other device allowing a signal to be injected into a line. The signal propagates along the line and is reflected on the singularities that it comprises. In the absence of a fault on the line, the signal is reflected on the end of the line if the termination of the line is not matched. In the presence of a fault on the line, the signal is reflected on the impedance discontinuity caused by the fault. The reflected signal is back-propagated up to a measurement point, which may be common to the point of injection or different. The back-propagated signal is captured via the directional coupler CPL then converted into digital by an analog-digital converter ADC. A correlation COR is subsequently carried out between the digital signal thus obtained and a copy of the digital signal generated prior to injection in order to produce a time-domain reflectogram R(t) corresponding to the intercorrelation between the two signals.

As is known in the field of diagnostic methods using time-domain reflectometry, the position $d_{DF}$ of a fault on the cable L, in other words its distance to the point of injection of the signal, may be directly obtained from the measurement, on the calculated time-domain reflectogram R(t), of the time $t_{DF}$ between the first amplitude peak measured on the reflectogram and the amplitude peak corresponding to the signature of the fault, based on the knowledge of a value of speed of propagation of signals in the line.

FIG. 1*bis* shows one example of a reflectogram R(n) obtained by means of the system in FIG. 1, on which a first amplitude peak is observed at an abscissa N and a second amplitude peak at an abscissa N+M. The first amplitude peak corresponds to the reflection of the signal at the point of injection into the cable, whereas the second peak corresponds to the reflection of the signal on an impedance discontinuity caused by a fault. The point of abscissa N is generally taken as time reference and is brought back to the abscissa 0 by subtraction of N.

Various known methods may be envisioned for determining the position $d_{DF}$ of the fault. A first method consists in applying the relationship associating distance and time: $d_{DF}=V_g \cdot t_{DF}/2$ where $V_g$ is the speed of propagation of the signal in the cable. Another possible method consists in applying a relationship of proportionality of the type $d_{DF}/t_{DF}=L_c/t_0$ where $L_c$ is the length of the cable and $t_0$ is the time, measured on the reflectogram, between the amplitude peak corresponding to the impedance discontinuity at the point of injection and the amplitude peak corresponding to the reflection of the signal on the end of the cable. In order to reduce the level of the measurement noise, an optional average calculation MOY may be performed before or after the correlation COR. The two locations of the average calculation are equivalent from an arithmetic standpoint.

An analysis device (not shown in FIG. 1) is responsible for analyzing the reflectogram R(t) in order to deduce from this information on the presence and/or location of faults together with the associated electrical characteristics of the faults.

Without straying from the framework of the invention, the emission and receiver parts of the system described in FIG. 1 may be implemented in the same device or in two separate devices. The emission part of the system comprises the signal generator, the digital-analog converter and the device for injecting the signal into a cable. The receiver part of the system comprises the device for measuring the signal back-propagated in the cable and the digital processing modules comprising the average and intercorrelation calculation.

Figure 2:
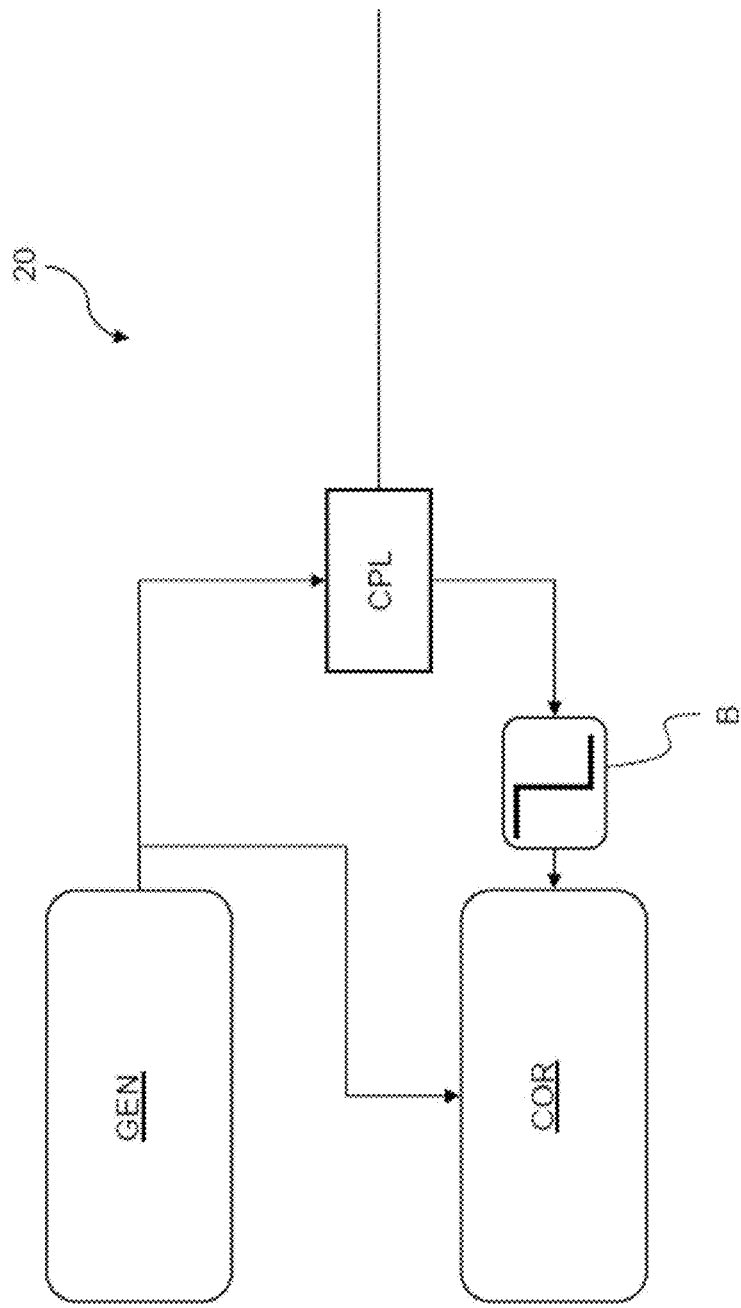

FIG. 2 describes a reflectometry system according to a first embodiment of the invention.

The system 200 comprises a generator GEN of the reference signal used. According to a first variant embodiment, the generator GEN is designed to directly generate a binary signal, for example a pseudo-random signal of the CTDR type. According to another variant embodiment, the generator GEN is designed to generate a digital signal quantized over several bits and furthermore comprises a mechanism for binarizing the digital signal generated. This binarization is an operation for transforming the digital signal into a series of binary values taking the values 0 or 1 or taking the values −1 or 1. The binarization is carried out such that any positive or zero value of the signal is transformed into a value equal to 1 and any negative value of the signal is transformed into a value equal to −1.

The generator GEN is, for example, implemented in the form of a programmable digital system, such as a processor or a reconfigurable circuit of the FPGA type. The generator GEN comprises at least one digital output pin to which a coupler CPL (or any other equivalent means) is connected which is able to inject the binary output signal from the generator GEN into the cable L.

The binary signal generated is delivered onto the digital output pin in the form of an analog signal for which the binary value 1 is delivered by a maximum voltage VCC and the binary value 0 (or −1) is delivered by a minimum voltage −VCC. The digital pin of the generator GEN is capable of delivering the voltages VCC and −VCC.

Advantageously, an impedance matching device is positioned between the output pin of the generator and the coupler CPL in order to match the output impedance of the generator with that of the cable L.

In one variant embodiment, if the digital pin cannot supply such voltages, notably the negative voltage −VCC, an additional component or circuit is disposed downstream of the output pin. This component is, for example, a Schmitt trigger whose high and low thresholds are fixed at a voltage equal to a value in the range between 0 and the maximum voltage VCC, for example VCC/2, and the power supply levels are fixed at the maximum VCC and minimum −VCC voltage values.

In another variant embodiment, the additional circuit is composed of a transformer, whose primary comprises N turns and whose secondary comprises 2N turns, and of a capacitor disposed upstream of the primary.

In yet another variant embodiment, the additional circuit is composed of a logic inverter between the voltages VCC and −VCC, together with two resistors arranged as a voltage divider between the minimum voltage −VCC and the digital input of the circuit.

The additional component must comprise a device for matching its input impedance to the impedance of the digital output pin of the generator.

Figure 3:
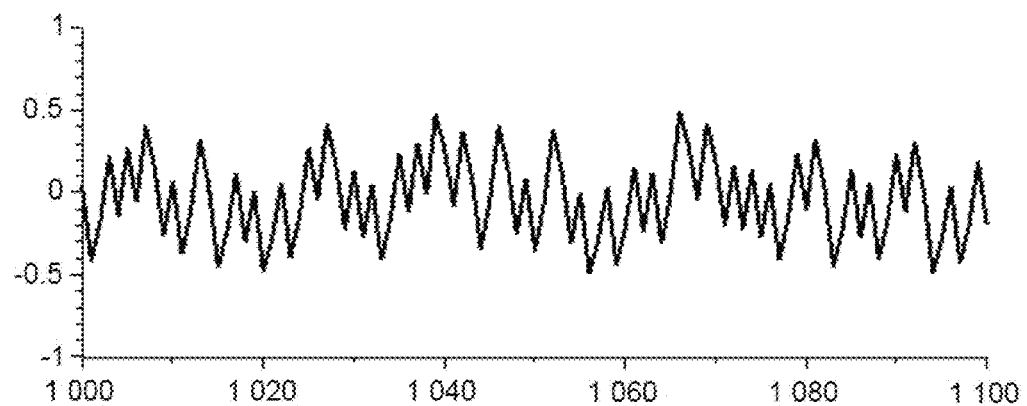
Figure 3:
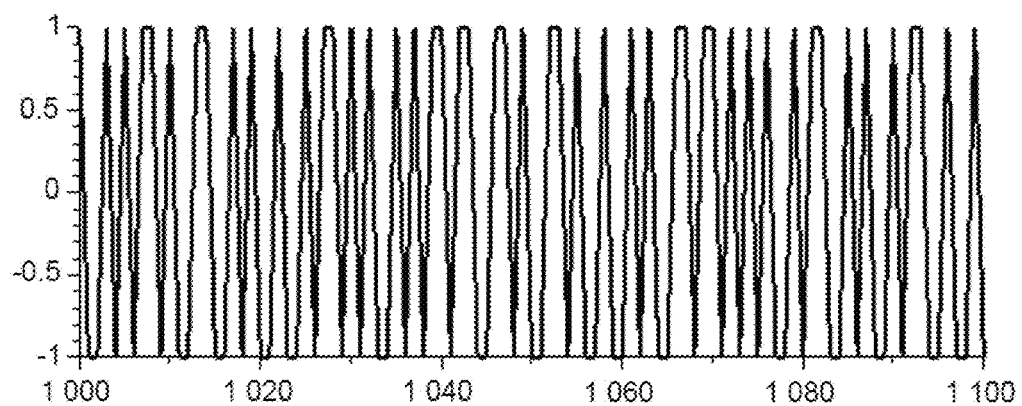

FIG. 3 respectively shows a chaotic pseudo-random signal such as generated (on the upper diagram) and the same signal after the binarization operation (lower diagram).

The signal back-propagated in the cable L is captured, in other words acquired or measured, by means of the coupler CPL (which may be identical or different from the coupler used for the injection of the signal) or any other means for measuring or acquiring the signal. This signal is analog. The binarization operation may be carried out directly by the digital component used COR, by connecting a digital input of the component (potential equipped with an impedance matching system) to the coupler CPL, or by means of an additional component or circuit inserted between the coupler CPL and the digital component COR. This circuit is a thresholding device of the flip-flop with threshold type, or a comparator B which allows the measured analog signal to be converted into a binary digital signal. The correlator COR subsequently carries out the intercorrelation calculation between the received signal and the signal injected into the cable.

The use of a binary or binarized signal in place of a non-binary digital signal offers several advantages.

In the first place, the system according to the invention such as described in FIG. 2 does not require any analog-digital converter nor digital-analog converter. This type of component is costly, consumes a lot of power and its use limits the speed of acquisition of the signal. Indeed, the higher the speed of acquisition or of conversion of the analog signal into a digital signal, the greater the number of samples per second which provides better results for the fault detection but leads to a higher cost for the component.

Furthermore, by virtue of the invention, the size of memory needed is also reduced. The number of bits used for sampling an analog signal is generally greater than 8 bits, which leads to a very large storage capacity being required. The greater the sampling dynamic range, the better are the performance characteristics in terms of detection for faults of low amplitude. By virtue of the invention, only one bit per sample is required which allows the size of memory to be reduced by a factor equal to at least 8. Lossless digital compression methods would allow this gain in memory space to be further improved.

Finally, the frequency of acquisition of the signal is increased by virtue of the invention as it is no longer limited to the sampling frequency of the analog-digital converter. Indeed, the frequency of acquisition of the signal for the system described in FIG. 2 is that of the thresholding device B which is close or equal to the frequency of the digital component GEN.

Figure 4:
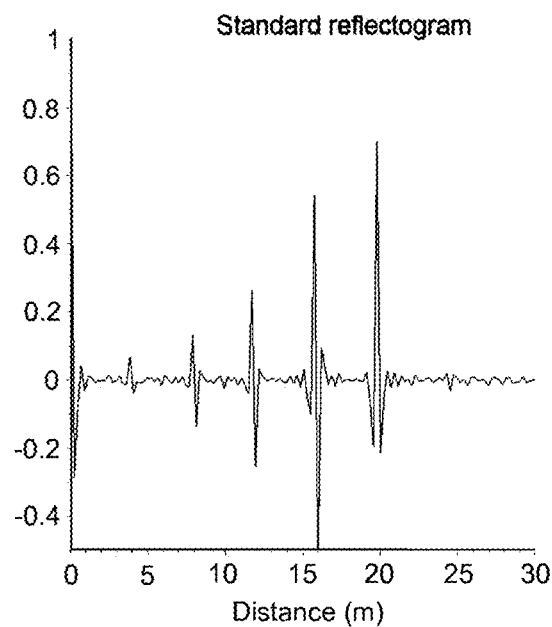
Figure 4:
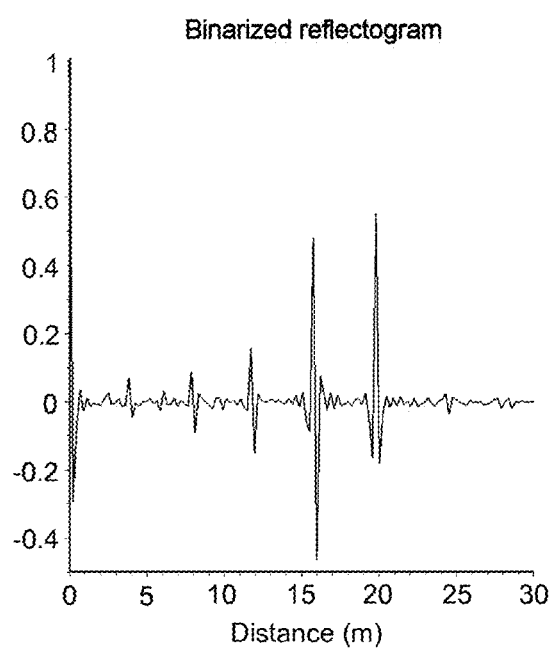

Another advantage of the invention is that, despite the loss of information in the measured signal owing to the decrease in the number of quantization bits, the reflectogram produced by the calculation of intercorrelation of the measured signal and of the generated signal is comparable to that which would be obtained with a method according to the prior art as is illustrated in FIG. 4.

This FIG. 4 shows two reflectograms obtained for a line of length equal to 20 meters comprising four regularly spaced soft faults of increasing amplitudes.

The upper diagram corresponds to a reflectogram obtained with a system according to the prior art comprising a digital-analog converter and an analog-digital converter. The lower diagram corresponds to a reflectogram obtained with a system according to the invention. The faults are correctly identifiable by equivalent amplitude peaks on the two diagrams.

Figure 5:
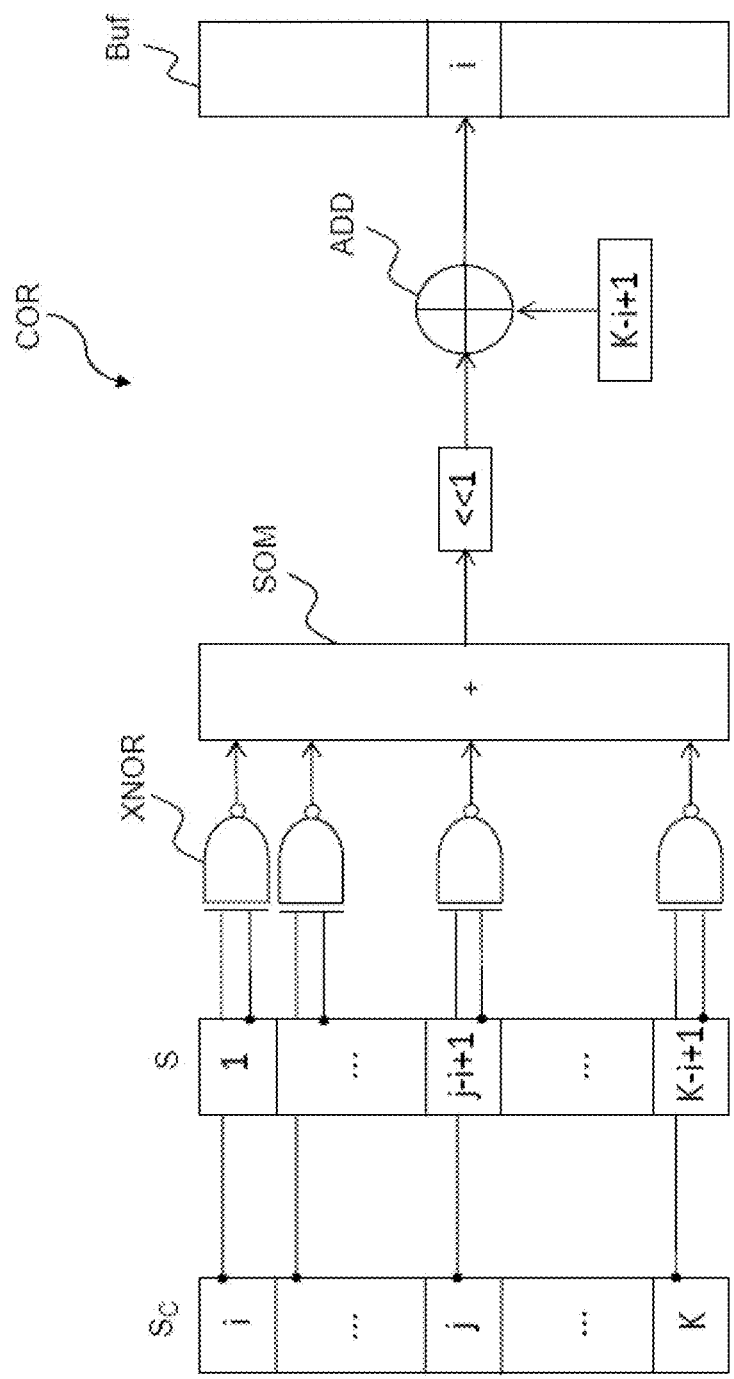

FIG. 5 shows a diagram of one example of a correlator COR according to one embodiment of the invention.

The fact that the values of the signals used by the system according to the invention are binary allows an acceleration of the calculation of the intercorrelation between the injected binarized signal $S_c$ and the measured binarized signal S. Indeed, the intercorrelation at a given moment in time represented by an index i may be expressed in the following form:

$$(S_c * S)(i) = \sum_{j=i}^{K} S(j)S_c(j-i+1), i = 1 \ldots K$$

Since the values of the signals $S_c$ and S are equal to 1 or −1, the preceding calculation may be simplified in the following manner:

$$S(k)S_c(j) = \begin{cases} 1 \text{ si } S_c(j) = S(k) \\ -1 \text{ si } S_c(j) \neq S(k) \end{cases}$$

Thus, the products $S(k)S_c(j)$ may be calculated by means of an "Exclusive NOR", also referred to as XNOR, logic gate and the value of index i of the intercorrelation product may be calculated by summing the outputs of the XNOR function bit by bit.

Another way of performing this sum consists in counting the number of times where the respective bits of the signals $S_c$ and S are equal (in other words where the output of the XNOR function is equal to 1).

$$\sum_{j=i}^{K} S(j)S_c(j-i+1) = \text{card}(E_i) - \text{card}(E_{-i})$$

In the preceding formula, Card(E) denotes the number of elements of a set E and the sets $E_i$, $E_{-i}$ are defined by:

$$E_i = \{j \geq i, S_c(j) = S(j-i+1)\}$$

$$E_{-i} = \{j \geq l, S_c(j) \neq S(j-i+1)\}$$

Furthermore, if the number of signal samples is equal to K−i+1, then card($E_i$)+card($E_{-i}$)=K−i+1.

Thus, the intercorrelation of index i is obtained by means of the following calculation:

$$\sum_{j=i}^{K} S(j)S_c(j-i+1) = 2*\text{card}(E_i) - (K-i+1) \tag{1}$$

Consequently, the correlator COR may be formed from one or more XNOR logic gate(s). Each logic gate XNOR receives the respective signals S and $S_c$ on its two inputs. The outputs of the XNOR logic gates are summed by means of a summer SOM. The summer SOM may be replaced by a counter designed to count the number of 1s at the output of the XNOR logic gates, this number corresponding to the number of values in the set $E_i$.

According to the embodiment described in FIG. 5, the result produced at the output of the summer SOM is shifted by one bit toward the left in order to carry out a multiplication by two. An adder ADD is subsequently used for adding the term K−i+1 to this result.

Lastly, the correlator COR comprises a register BUF for saving the values of the reflectogram R thus calculated.

Without straying from the framework of the invention, the correlator described in FIG. 5 may be arranged differently in order to fulfill the same function. For example, it may comprise only one XNOR logic gate and a counter in place of the summer SOM. The operation for multiplication by 2 may also be carried out by means of a multiplier.

The correlator COR described in FIG. 5 operates with binary signal samples taking the values 0 or 1.

The correlator thus designed allows an intercorrelation calculation to be performed more simply and faster because it does not require any multiplication or Fourier transform.

Another aspect of the invention is now described that relates to the use of binary or binarized reflectometry signals such as previously described with a correlator implementing the method for calculating a reflectogram described in the French patent application from the applicant filed under the number FR1662396 on 14 Dec. 2016. This aforementioned application is incorporated by reference in the present application.

The patent application FR1662396 relates to a method for calculating a reflectogram allowing the number of operations to be implemented to be better distributed in order to render the calculation more efficient.

Figure 6:
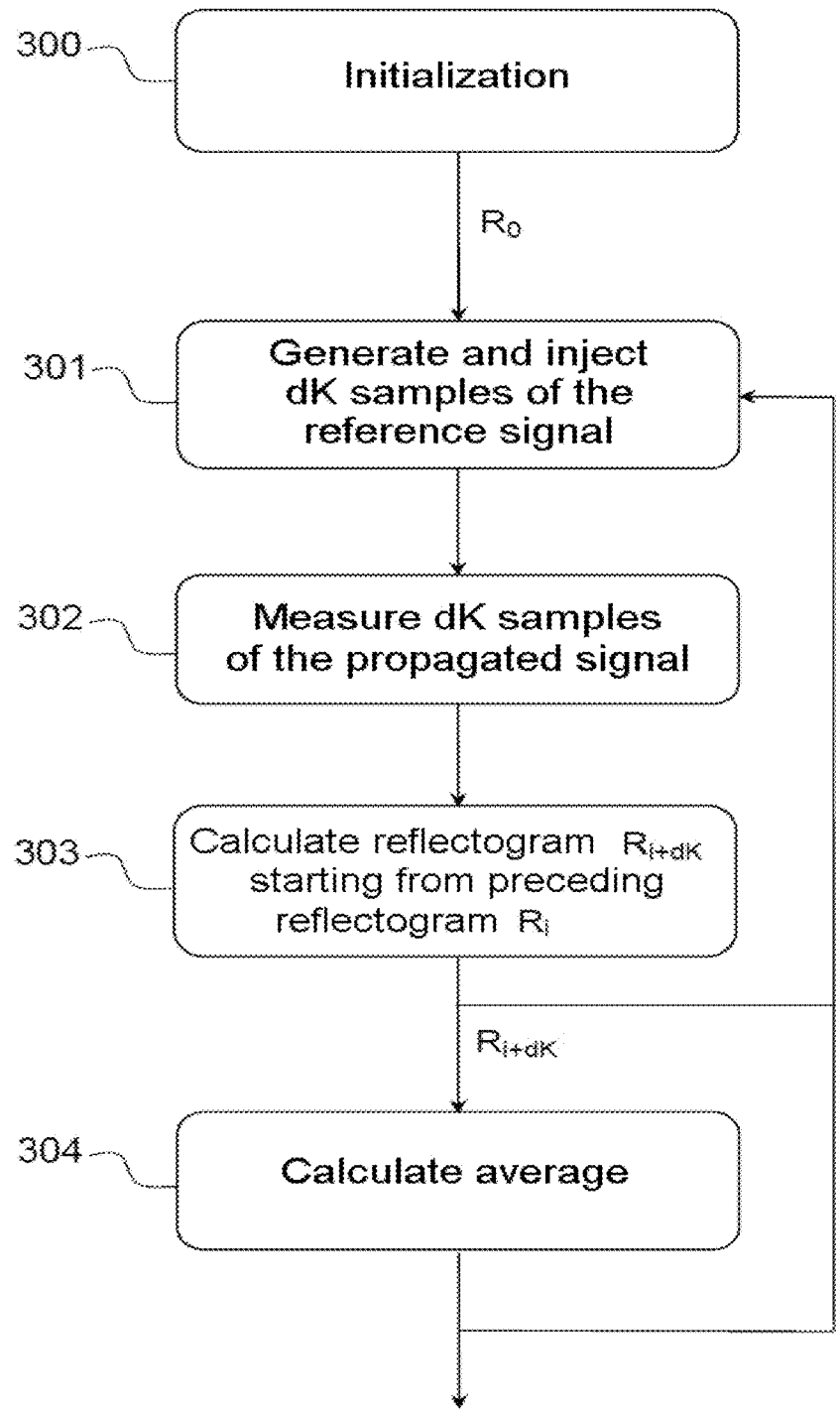

FIG. 6 shows schematically the main steps of the method for calculating a reflectogram such as described in the patent application FR1662396.

The method begins with an initialization step 300 which comprises the following sub-steps:
  Generation and injection in the cable of first K samples of the reference signal,
  Measurement of K samples of the signal propagated in the cable,
  Initial calculation of the reflectogram $R_0$ based on the intercorrelation between the K samples of the injected signal and the K samples of the measured signal.

The initialization step 300 may also be made optional. In this case, the reflectogram $R_0$ is reset to 0, then the following steps of the method are directly executed. It is then necessary to wait to have measured K samples of the signal propagated in the cable in order to obtain a complete reflectogram but with the advantage of a gain in calculation time at the start of the method.

The number K is a parameter of the method and corresponds to the length (in number of samples) of the intercorrelation carried out between the reference signal and the measured signal for calculating the reflectogram.

The measurement of the signal may be carried out simultaneously with the injection of the signal into the cable or may be carried out with an initial time delay.

In the case of a reflectometry device for which the measurement device is distinct from the device for injecting the signal, the measurement device comprises a generator of the reference signal whose role is to generate a copy of the reference signal injected into the cable by the injection device. This copy is used for calculating the reflectogram.

The initialization step 300 produces a first, initial, reflectogram denoted $R_0$.

The method continues with the iterative execution of the steps 301,302,303.

The two steps 301,302 of the method consist in iteratively generating and injecting 301 into the cable dK samples of the reference signal then in measuring 302 dK samples of the signal propagated in the cable. The number dK is a parameter of the invention and is preferably chosen to be much lower than the value of K. The value of dK is equal to at least 1.

The steps 301 and 302 are executed iteratively, in other words, at each time i, dK signal samples are injected into the cable and dK back-propagated signal samples are measured. The injection and the measurement of the signal are continuously carried out for the whole duration of the analysis of the cable.

At each time i, corresponding to one iteration, the last K samples of the injected signal and the last K samples of the measured signal are saved in a buffer or a local memory with a view to performing an intercorrelation calculation over a period corresponding to the last K samples. It is recalled that the value of dK is assumed to be much lower than the value K. It is assumed that the measured signal has been previously digitized in order to conserve digital samples.

Figure 7:
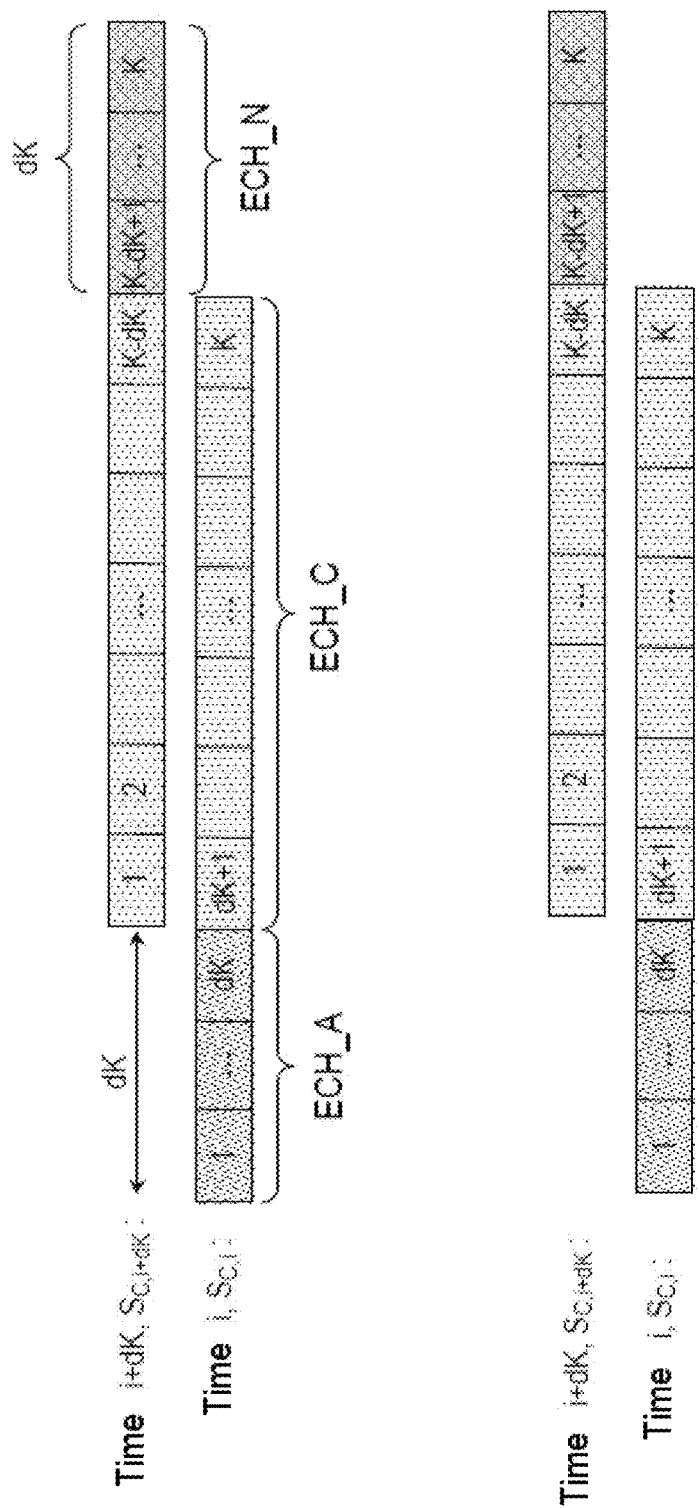

FIG. 7 illustrates a representation of the buffer containing the last K samples of the reference signal, on the one hand, and of the measured signal, on the other, at two successive times i and i+dK. Between these two successive times, a number dK of new signal samples are injected into the cable and the same number dK of new signal samples are measured.

The upper part of FIG. 7 shows the buffer $S_{c,i}$ containing the samples of the reference signal saved at the time i and the buffer $S_{c,i+dK}$ containing the samples of the reference signal saved at the following time i+dK.

The oldest dK samples of the buffer $S_{c,i}$ (denoted ECH-A in FIG. 7) are eliminated from the buffer $S_{c,i+dK}$ at the following time i+dK. The most recent K−dK samples of the buffer $S_{c,i}$ (denoted ECH-C in FIG. 7) are shifted in the buffer $S_{c,i+dK}$ to the following time i+dK. Finally, the buffer $S_{c,i+dK}$ contains dK new samples (denoted ECH-N in FIG. 7) at the following time i+dK.

In the same way, the lower part of FIG. 7 shows the buffer $S_i$ containing the samples of the measured signal, saved at the time i, and the buffer $S_{i+dK}$ containing the samples of the measured signal, saved at the following time i+dK.

FIG. 7 allows it to be observed that, at two successive times i and i+dK, the buffer containing the last K samples of the reference signal exhibit K−dK identical values. Similarly, at two successive times i and i+dK, the buffer containing the last K samples of the measured signal also exhibits K−dK identical values.

A value $R_i(n)$ of the reflectogram $R_i$ at the time i corresponds to the intercorrelation between the samples of the buffer $S_{c,i}$ containing the last K samples of the reference signal and the samples of the buffer $S_i$ containing the last K samples of the measured signal. This calculation is given by the relation (2) herein below.

$$R_i(n)=(S_c*S)_i(n)=\Sigma_{j=1}^{K-n+1}S_{c,i}(j) \cdot S_i(n+j-1) \quad (2)$$

The index n varies over all of the time domain values for which the reflectogram $R_i$ is calculated. The equation (2) therefore yields one value of the reflectogram $R_i$ for one time domain value of index n.

In order to generate a complete reflectogram, the equation (2) has to be executed by varying the index n over the whole of the time interval corresponding to the duration of the reflectogram. Thus, the index n varies from 1 to K.

The value of index n of the reflectogram $R_i$ calculated at the time i may be decomposed into two sums, starting from the equation (2), which becomes the equation (3):

$$R_i(n)=\Sigma_{j=1}^{dK}S_{c,i}(j) \cdot S_i(n+j-1)+\Sigma_{j=dK+1}^{K-n+1}S_{c,i}(j) \cdot S_i(n+j-1) \quad (3)$$

In the same way, the value of index n of the reflectogram $R_{i+dK}$ calculated at the time i+dK may be decomposed into two sums such as illustrated by the equation (4):

$$R_{i+dK}(n)=\Sigma_{j=1}^{K-n-dK+1}S_{c,i+dK}(j) \cdot S_{i+dK}(n+j-1)+\Sigma_{j=K-n-dK+2}^{K-n+1}S_{c,i+dK}(j) \cdot S_{i+dK}(n+j-1) \quad (4)$$

According to the illustration in FIG. 7, it is known that the values ECH_C of the samples of the reference signal $S_c$ stored at the time i+dK, going from the indices 1 to K−dK, are identical to the values of the samples of the reference signal $S_c$ stored at the time i, going from the indices dK+1 to K. The same conclusion may be applied to the measured signal S.

From these observations and from the equations (3) and (4) may be deduced the recurrence relationship (5) between a value of the reflectogram calculated at the time i and the same value of index n of the reflectogram calculated at the following time i+dK:

$$R_{i+dk}(n) = R_i(n) - \sum_{j=1}^{dK} S_{c,i}(j) \cdot S_i(n+j-1) + \sum_{j=K-n-dK+2}^{K-n+1} S_{c,i+dk}(j) \cdot S_{i+dK}(n+j-1) \quad (5)$$

Thus, the values of the reflectogram at a time i+dK are determined starting from the values of the reflectogram at a preceding time i at the step 303 of the method.

The step 303 thus consists in subtracting, from the preceding reflectogram $R_i$, the products of correlation between the dK samples of the measured signals at the preceding time i and a number dK of corresponding samples of the reference signals injected into the transmission line at the time i, then in adding to the preceding reflectogram $R_i$ the products of correlation between the dK new samples measured to the current time i+dK and a number dK of corresponding samples of the reference signals injected into the transmission line at the current time i+dK.

Thus, the calculation of the current reflectogram carried out at the step 303 comprises a substantially reduced number of operations to be carried out. A minimum number of operations is reached for a value of dK equal to 1 sample.

The formulae (2) to (5) are given by considering that the time of injection of new samples of the reference signal into the cable and the time of measurement of new samples of the signal propagated in the cable are identical and correspond to the index i. With no loss of generality, the time of injection i' and the time of measurement i may be different, the equations (2) to (5) may then be rewritten by replacing i with i' in the expressions for the measured signal S. The injection of the signal and its measurement must however be synchronized and operate at an identical sampling cadence.

The steps 301,302,303 are iterated for a period corresponding to the duration of analysis of the cable.

The step 303 is executed for all the values of a reflectogram. Thus, the calculation expressed by the formula (5) is executed in parallel for n values of a reflectogram, corresponding to n successive time indices.

One particular embodiment of the invention relates to the case where the number dK of samples injected then measured at each time i is equal to 1. This scenario is that for which the number of operations needed at each iteration for calculating a reflectogram is lowest.

For this particular embodiment, the step 303 for calculation of the reflectogram may be simplified starting from the equation (5) in the following manner.

At the current time i, the product $S(n)*S_c(1)$ is subtracted from each indexed value n of the reflectogram $R_i(n)$, then the samples in the two buffers S and $S_c$ are shifted by a value and the new sample of the injected reference signal is recorded in the buffer $S_c$ and the new sample of the measured signal is recorded in the buffer S. Finally, the product $S(K)*S_c(K+1-n)$ is added to each indexed value n of the reflectogram $R_i(n)$.

Using binary or binarized signals, the method for calculating a reflectogram described hereinabove may be further optimized, according to the invention, in order to decrease the number of operations to be carried out.

Indeed, again taking the example hereinabove given for dK=1, subtracting the product $S(n)*S_c(1)$ corresponds, for binary signals, to adding the result of an Exclusive OR or XOR operation applied to the values $S(n)$ and $S_c(1)$.

In addition, adding the product $S(K)*S_c(K+1-n)$ corresponds, for binary signals, to adding the result of an Exclusive NOR or XNOR operation on the values $S(K)$ and $S_c(K+1-n)$.

Thus, this method of incremental calculation of the reflectogram may only be implemented, for binary signals, using XOR and XNOR logic gates.

Figure 8:
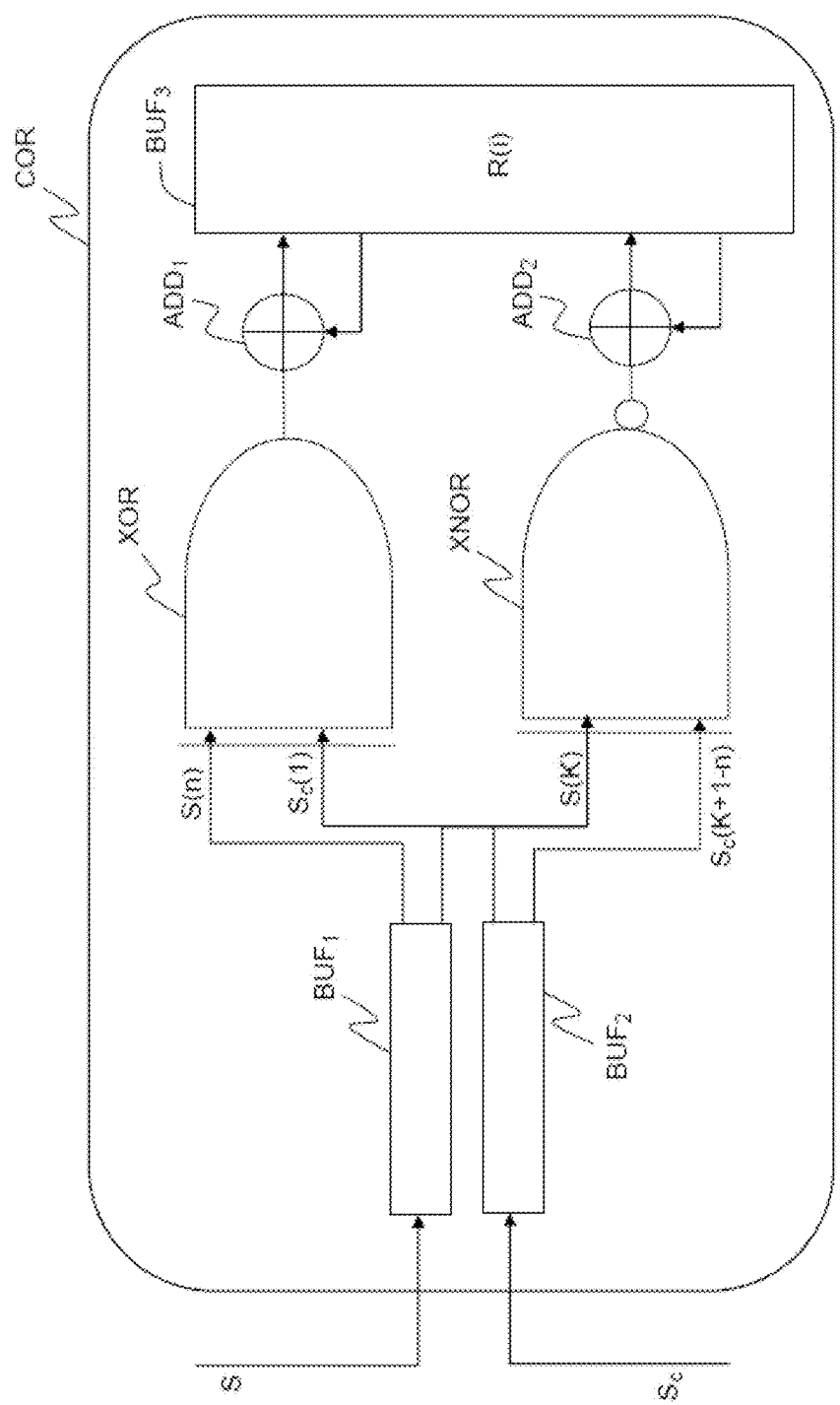

FIG. 8 shows a diagram of a correlator COR according to a second variant embodiment of the invention, this correlator implementing the aforementioned incremental calculation. Such a correlator COR comprises at least one logic gate XOR and one logic gate XNOR, together with two shift registers $BUF_1, BUF_2$. The first shift register $BUF_1$ is designed to receive the samples of the binary signal S generated by the component GEN. The second shift register $BUF_2$ is designed to receive the samples of the binary signal $S_c$ obtained at the output of the thresholding device B. The correlator COR also comprises two adders $ADD_1, ADD_2$ and a third register $BUF_3$ for saving the calculated values R(i) of the reflectogram. The logic gate XOR and the first adder $ADD_1$ are configured for adding to the current value R(i) the result of the Exclusive OR operation applied to the samples $S(n)$ and $S_c(1)$. The logic gate XNOR and the second adder $ADD_2$ are configured for adding to the current value R(i) the result of the Exclusive NOR operation applied to the samples S(K) and S(K+1−n). In this second embodiment of the correlator COR, the samples of the binary signals S and $S_c$ take the values +1 or −1. Consequently, all the components of the correlator COR, in particular the logic gates XOR and XNOR operate in +1/−1 logic mode rather than in 1/0 logic mode.

In the case where 1/0 binary logic is used rather than 1/−1 binary logic, the incremental reasoning described hereinabove is applied to the equation (1):

$$\sum_{j=i}^{K} S(j)S_c(j-i+1) = 2*\text{card}(E_i) - (K-i+1)$$

At the current time i, the result of an Exclusive OR operation XOR on the values S(1) and $S_c(n)$ shifted by one bit to the left (so as to multiply it by 2) is subtracted from each indexed value n of the reflectogram $R_i(n)$.

Subsequently, the samples in the two shift registers S and $S_c$ are shifted by a value and the new sample of the reference injected signal is recorded in the shift register $S_c$ and the new sample of the measured signal in the shift register S.

The shift operation may be eliminated by implementing a technique similar to that of circular registers, in which the index of the oldest samples replaced by the samples measured at the current time is incremented or decremented in a circular manner (modulo the size of the register).

Lastly, the result of an Exclusive OR XOR operation on the values S(K−n+1) and $S_c(K)$ shifted by one bit to the left is added to each indexed value n of the reflectogram $R_i(n)$.

Those skilled in the art will readily be able to adapt the device in FIG. 8, described for a 1/−1 binary logic, to an incremental calculation in 1/0 binary logic such as described hereinabove, notably by this time using two XOR logic gates rather than one XOR logic gate and one XNOR logic gate as described in FIG. 8.

The invention is applicable to any type of reflectometry signals but more particularly to pseudo-random signals such as chaotic signals CTDR. This is because the pseudo-random nature of these signals avoids the degradation of the quality of the intercorrelation of the measured signal with the injected signal when the signal is binary or binarized.

This advantage is important in the field of the detection and localization of faults on a cable because the identification of the faults is linked to the identification of amplitude peaks in the result of the intercorrelation.

Figure 9:
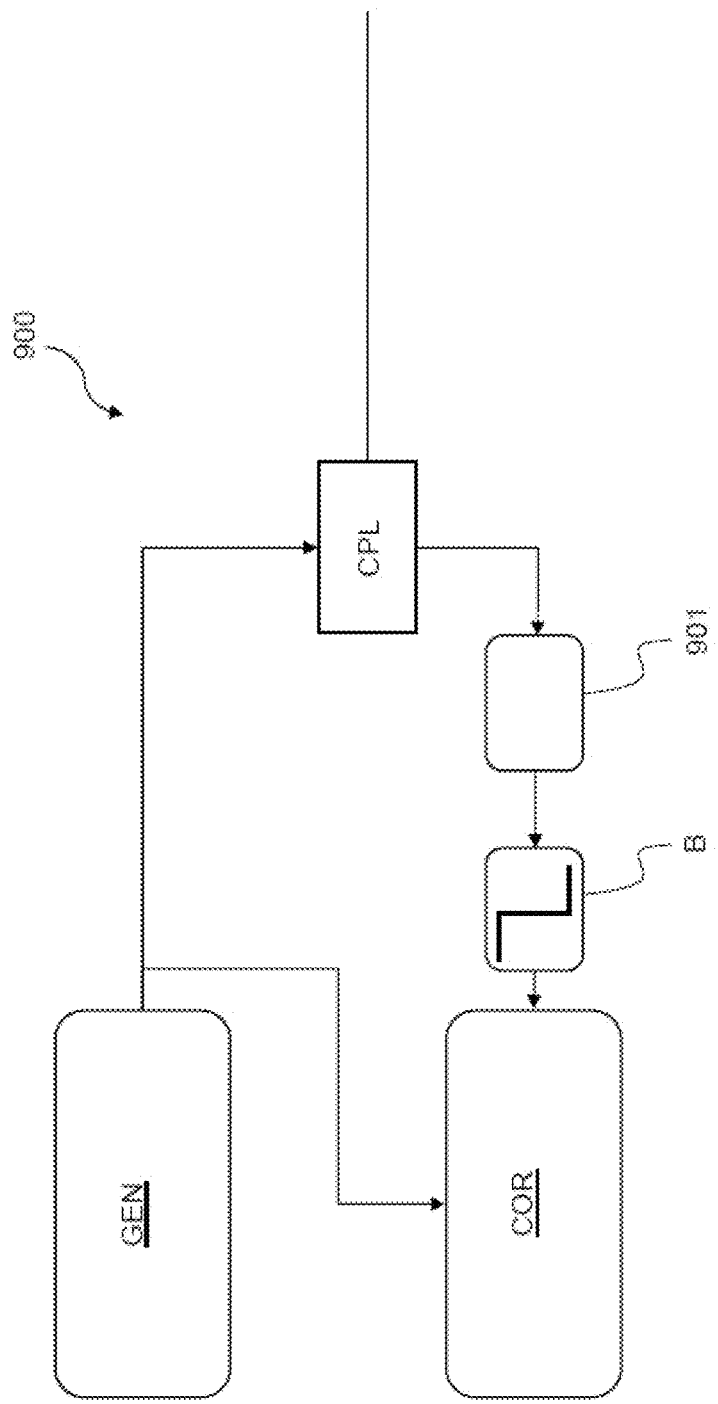

FIG. 9 describes a second embodiment of a reflectometry system according to the invention.

The system in FIG. 9 comprises the same elements as that described in FIG. 2 but furthermore comprises an analog white noise generator 901, disposed between the coupler CPL and the binarization device B of the analog signal. The analog white noise generated by the generator 901 is, for example, a Gaussian additive white noise. It is added to the analog signal measured by the coupler CPL.

One advantage of the system described in FIG. 9 is that the addition of white noise to the analog measured signal allows, on the final reflectogram, the peaks of low amplitude corresponding to soft faults to be better highlighted. Indeed, the peaks of low amplitude may sometimes be masked by nearby peaks of higher amplitude. The addition of white noise allows, on average, these peaks of low amplitude to be better highlighted. The amplitude of the added white noise is, preferably, equal to at least the average amplitude of the signal. Advantageously, the amplitude of the added white noise is around two to three times higher than the average amplitude of the signal.

Figure 10:
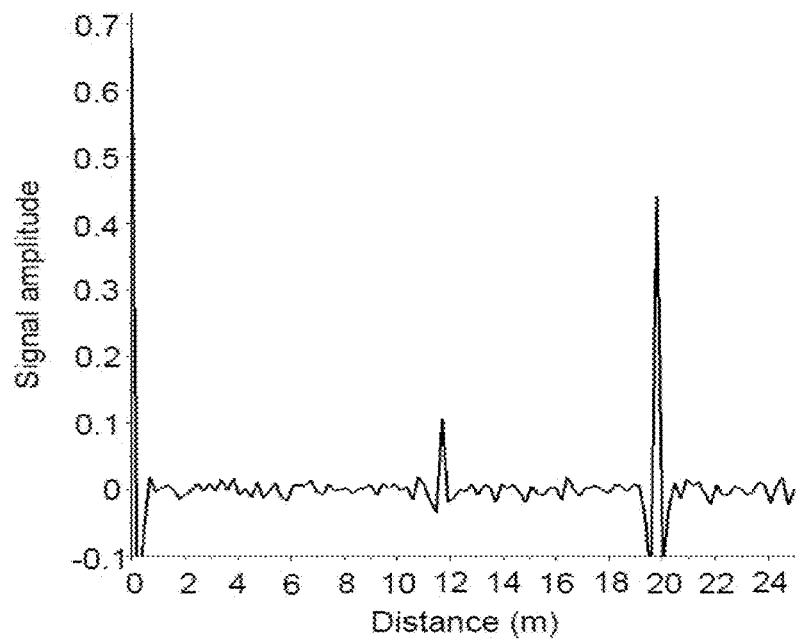
Figure 10:
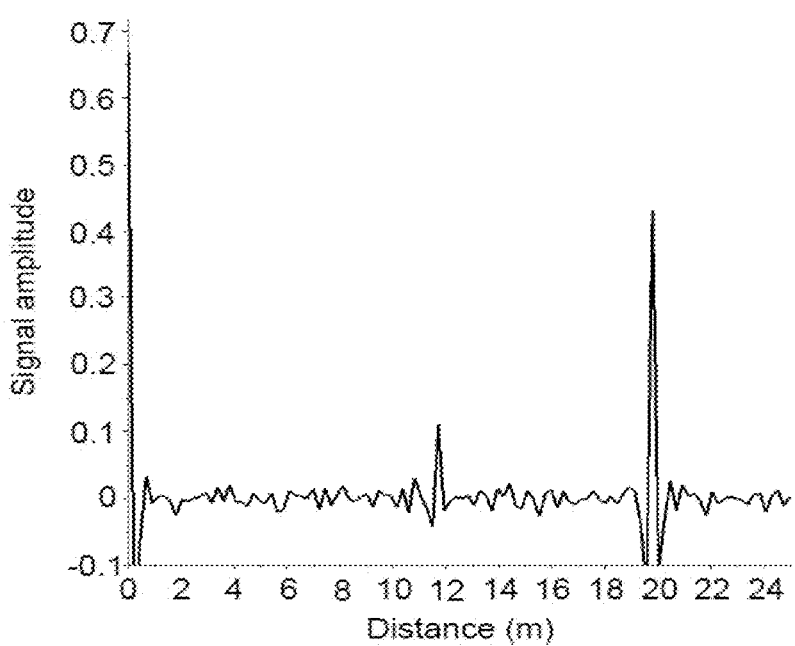

FIG. 10 shows two reflectograms obtained for a line of length equal to 20 meters comprising a soft fault of low amplitude in the middle of the cable.

The left-hand diagram corresponds to a reflectogram obtained with a system according to the prior art comprising a digital-analog converter and an analog-digital converter. The right-hand diagram corresponds to a reflectogram obtained with a system according to the second embodiment described in FIG. 9.

Figure 11:
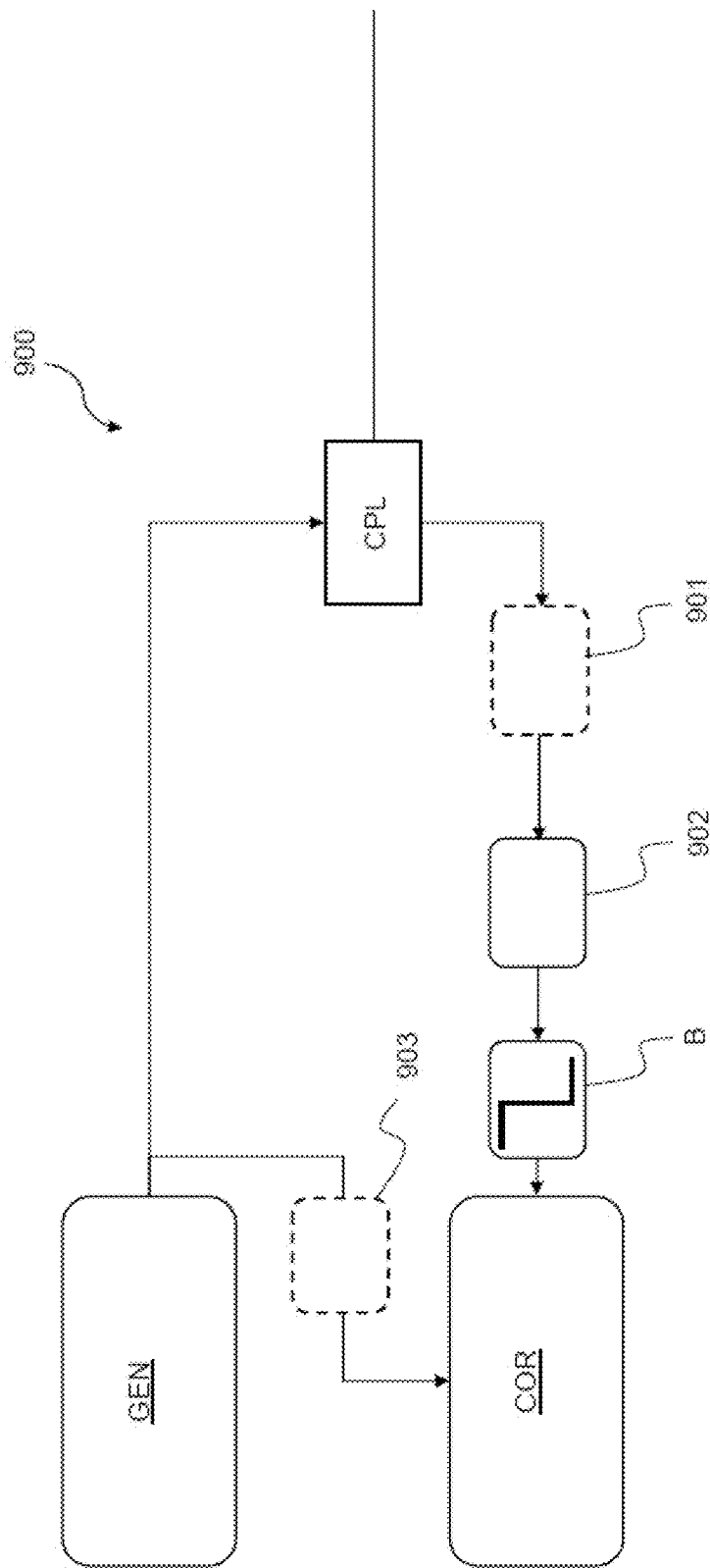

FIG. 11 describes a third embodiment of a reflectometry system according to the invention.

The system in FIG. 11 comprises the same elements as the system described in FIG. 2 but furthermore comprises a differentiator circuit 902 disposed between the output of the cable and the binarization device B.

A differentiator circuit is configured for performing a time derivative operation on the analog signal measured by the coupler CPL. A differentiator circuit is configured for determining the difference between the value of the signal at a time t and its value at a preceding time t−1.

The addition of a time derivative or differentiation operation prior to the binarization operation also allows the amplitude peaks to be better highlighted in the final reflectogram. In this case, the amplitude peaks are bipolar as is identified in FIG. 13.

Figure 13:
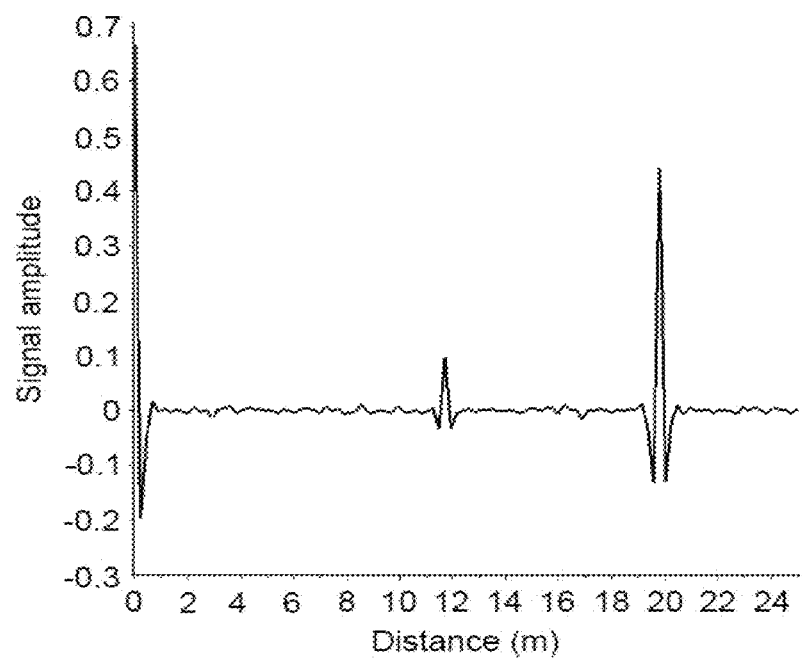
Figure 13:
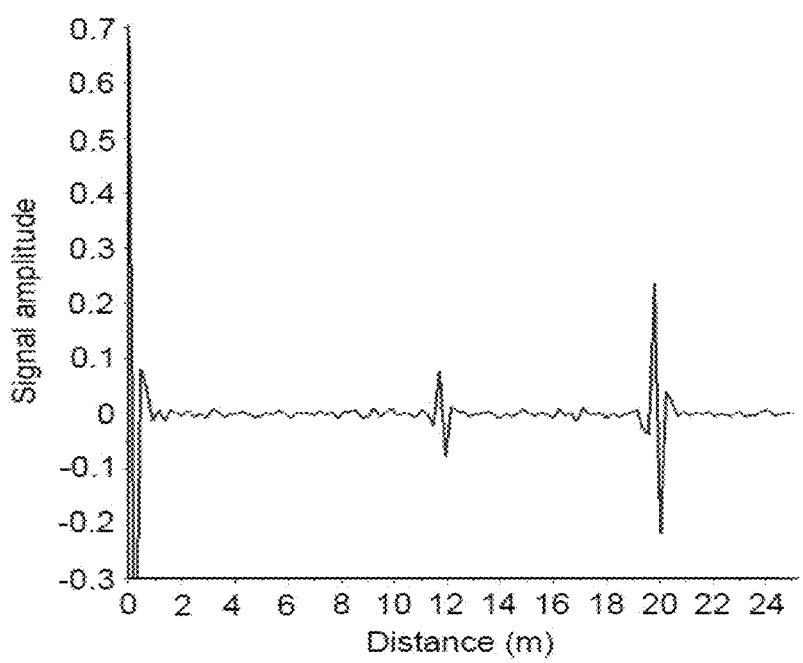

FIG. 13 shows two reflectograms obtained for a line of length equal to 20 meters comprising a soft fault of low amplitude in the middle of the cable.

The upper diagram corresponds to a reflectogram obtained with a system according to the prior art comprising a digital-analog converter and an analog-digital converter. The lower diagram corresponds to a reflectogram obtained with a system according to the third embodiment described in FIG. 11.

The system in FIG. 11 may or may not comprise a white noise generator 901 disposed upstream of the circuit 902.

Figure 12:
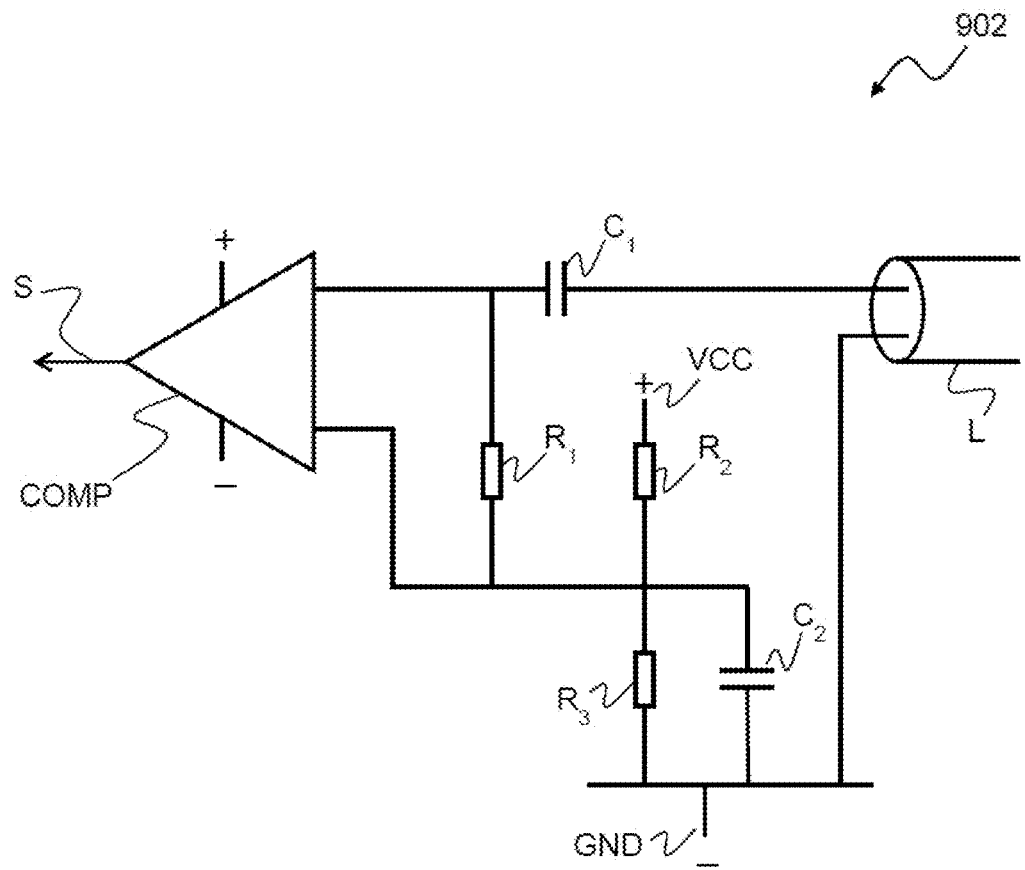

FIG. 12 shows schematically one example of a differentiator circuit 902 designed to carry out a time derivative operation.

Such a circuit 902 comprises two capacitors $C_1$, $C_2$ and three resistors $R_1$, $R_2$, $R_3$ arranged in the manner shown in FIG. 12. It also comprises a ground GND and a power supply VCC. Furthermore, it comprises a comparator COMP whose output S is directly connected to the circuit implementing the binarization operation. The input of the circuit 902 is directly connected to the cable L by means of a coupler CPL (not shown in FIG. 12).

The circuit 902 may be implemented by any other embodiment allowing a time derivative or differentiation function of an analog signal to be carried out, for example by means of a sample-and-hold circuit and of an analog memory.

According to one variant of the third embodiment of the invention described hereinabove, a time derivative or differentiation operation is applied to the binary signal generated prior to carrying out the intercorrelation with the binarized signal at the output of the binarization device B. This operation may be carried out by the correlator COR or by a digital circuit 903 designed to calculate the derivative or the term to term difference of the output signal from the generator GEN inserted between the generator GEN and the correlator COR. The circuit 903 and the correlator COR are, for example, implemented on one and the same integrated circuit or FPGA circuit. This variant notably offers the advantage of obtaining monopolar amplitude peaks, in the reflectogram, rather than bipolar as is the case if the derivative or differentiation operation is only applied to the measured signal.

A fourth embodiment of the invention is now described which is more particularly aimed at improving the detection capacity for soft faults generating, in the reflectogram, signatures of very low amplitude.

Figure 14:
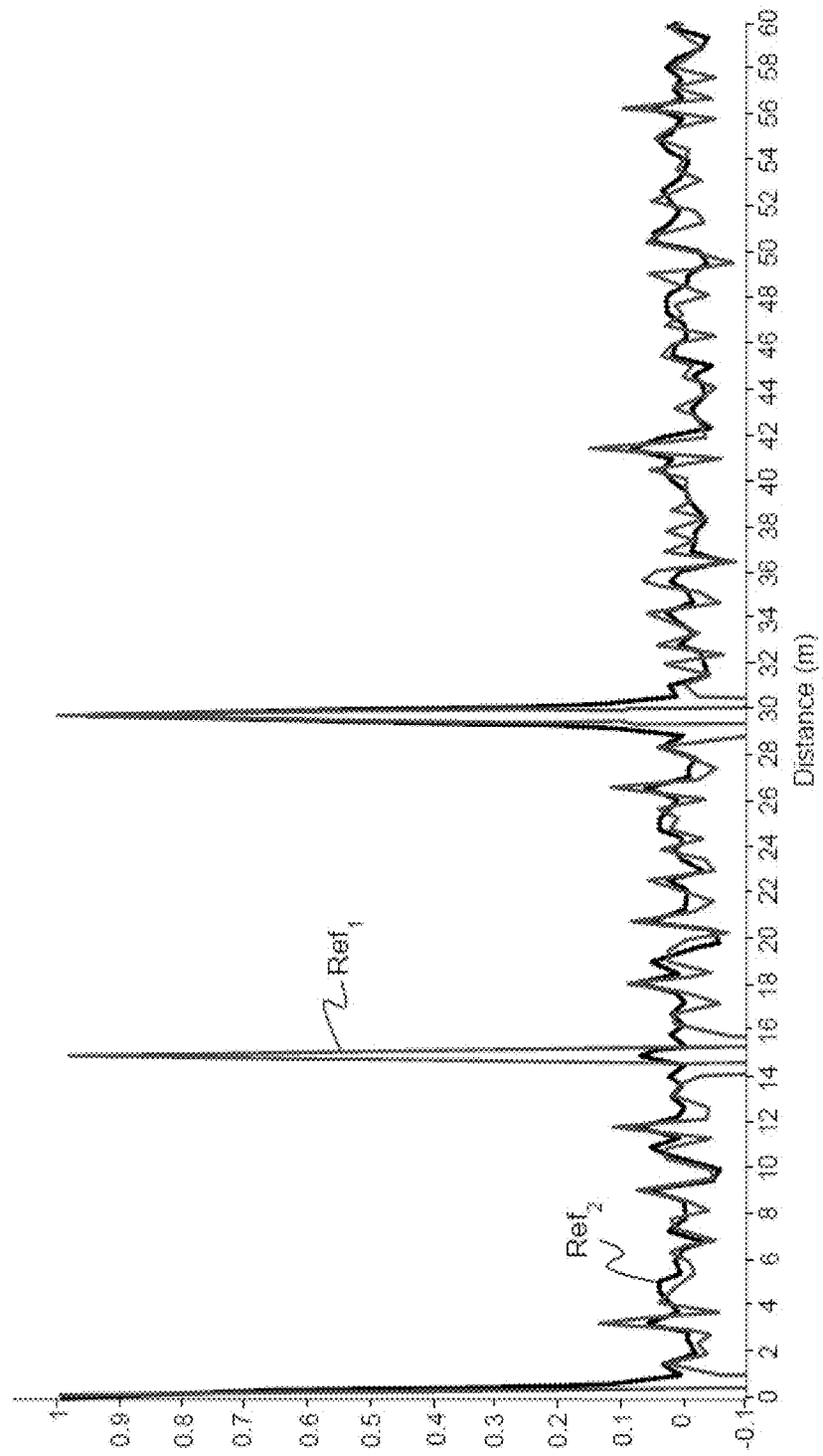

FIG. 14 shows, on a timing diagram, two examples of reflectograms obtained for a cable of length equal to 30 meters and exhibiting a surface soft fault at 15 meters. The assumption is made that the amplitude of the first peak corresponding to the point of injection of the signal and the amplitude of the last peak corresponding to the end of the cable are equal. The first reflectogram $Ref_1$ is obtained with a system according to the invention. The second reflectogram $Ref_2$ is obtained with a system according to the prior art for which the measured signal is not binarized.

The amplitude of the peak of the reflectogram corresponding to the soft fault situated at 15 meters is of the order of 0.1. It may be seen that this peak is buried in the secondary lobes of the reflectogram $Ref_2$ in the case where the measured signal is not binarized. It is therefore not possible to detect this peak in a reliable manner with a system according to the prior art.

In contrast, on the reflectogram $Ref_1$ obtained with the invention, it can be seen that the peak corresponding to the soft fault is amplified. This phenomenon is linked to the binarization of the measured signal. This is because the values of the reflected signal close to 0 are amplified to the values +1 or −1 after binarization.

The signal injected into the cable is reflected at the end of the cable that is initially assumed to have no fault. The back-propagated signal which is measured may be considered as the sum of the injected signal and of the same signal delayed by a delay equal to the time for the return journey of the signal between the point of injection and the measurement point going via the end of the cable. When the injected signal is binary, it takes the values 1 or −1. Thus, the measured signal, after back-propagation, takes the values 2, −2 or 0 (omitting, for the sake of simplicity, the amplification or attenuation due to the mismatch at the point of injection and at the termination of the cable). In reality, the measured signal takes the value 0 in around 50% of cases. It is subsequently considered that a soft fault is present and that it generates a reflection of the signal of low amplitude, for example equal to 0.1. The values at 0 in the measured signal then become 0.1 or −0.1. After binarization, these values become 1 or −1. Thus, the binarization allows the signature of a soft fault to be amplified generating a reflection of the signal of low amplitude.

However, this phenomenon depends greatly on the equality of the amplitudes of the signal transmitted after the point of injection and of the signal reflected at the end of the cable. More generally, it is observed that it is possible to detect a soft fault which generates a reflection of the signal of amplitude greater than or equal to the difference in the amplitudes of the signal transmitted after the point of injection and of the signal reflected at the end of the cable. In other words, the closer are these two amplitudes, the greater the possibility of detecting soft faults generating low amplitudes in the reflectogram calculated after correlation.

Thus, in order to improve the precision of the detection of soft faults of low amplitude, the reflectometry system according to the invention should be modified by adding a device whose function is to optimize the equalizing of the amplitudes of the signal transmitted after the point of injection and of the signal reflected at the end of the cable.

Figure 15:
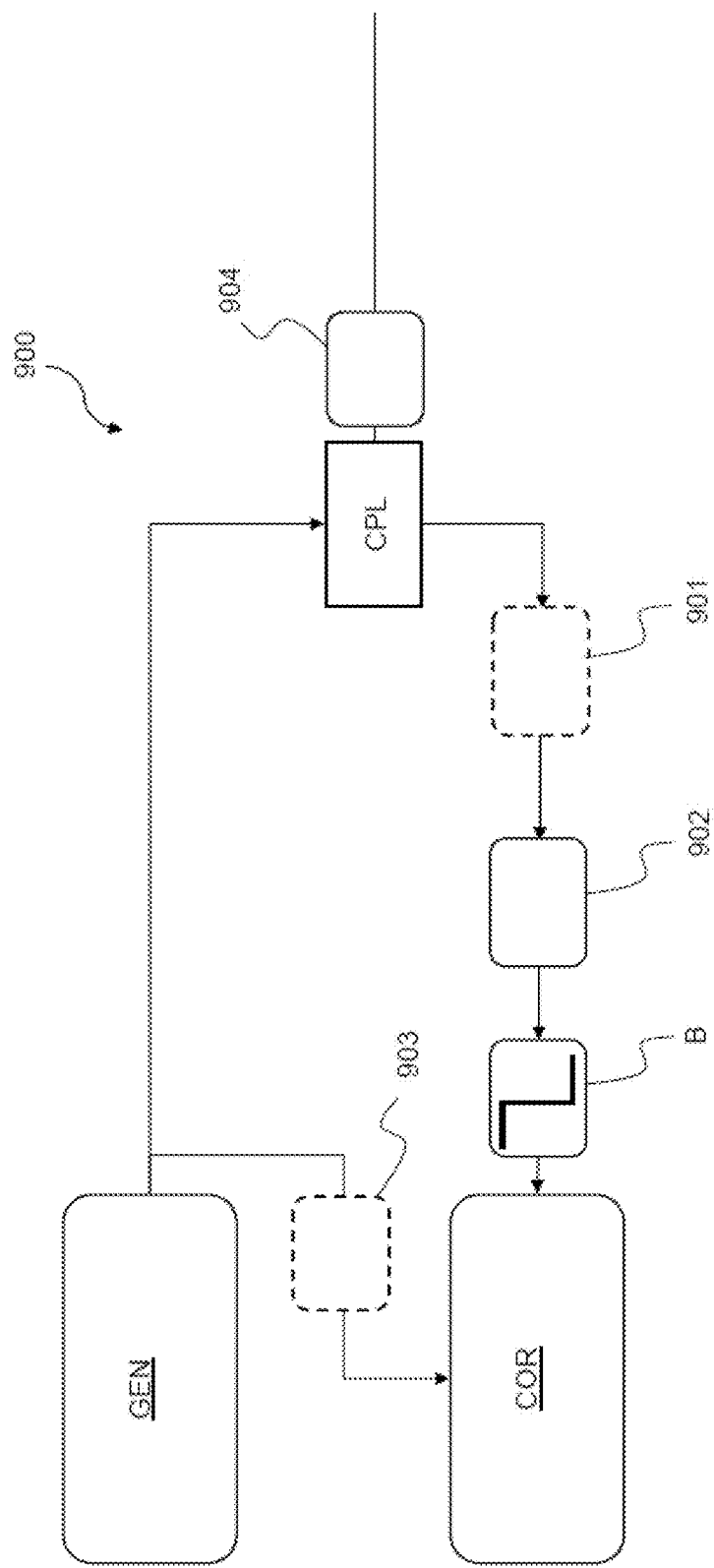

For this purpose, FIG. 15 describes a fourth embodiment of a reflectometry system according to the invention.

The system in FIG. 15 comprises the same elements as the system described in FIG. 11 (the elements 901,902,903 are optional) but furthermore comprises an equalizer 904 configured for equalizing the amplitudes of the signal transmitted after the point of injection into the cable and of the signal reflected at the end of the cable.

Figure 16:
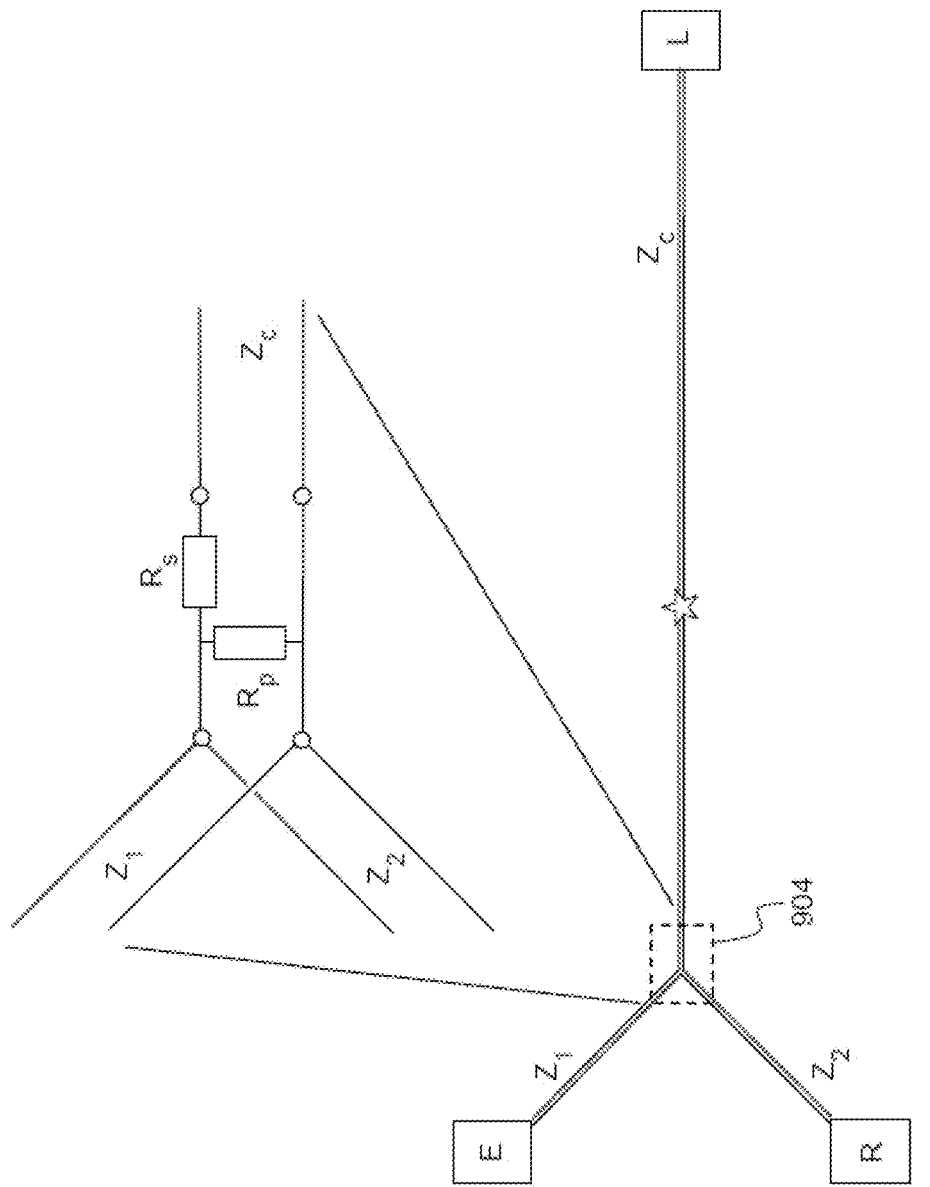

FIG. 16 shows schematically one embodiment of the equalizer 904. It is composed of a voltage divider bridge or resistor bridge comprising two resistors $R_P$ and $R_S$ disposed upstream of the connection of the reflectometry system to the cable. For example, the equalizer 904 is a two-port network which is connected, on the one hand, to the cable and, on the other, directly to the tracks of the printed circuit on which the system according to the invention is implemented. FIG. 16, shows schematically the emission part E of the system which essentially comprises the generator GEN and a track or connection of impedance $Z_1$ which connects this part of the system to the cable. The receiver part R of the system comprises the binarization device B and the correlator COR. It is also connected via a track or connection of impedance $Z_2$ to the cable. The connection of the tracks to the cable may be made by means of a coupler CPL (not shown). The cable has a characteristic impedance $Z_c$. The load at the end of the cable has an impedance $Z_L$ and the receiver part R of the system has an impedance $Z_R$. The impedances $Z_1$, $Z_2$ and $Z_R$ are fabrication parameters of the system. The impedances $Z_c$ and $Z_L$ depend on the cable to be tested.

The values of the resistors $R_P$ and $R_S$ are determined in such a manner as to equalize the amplitudes of the signal at the point of injection and at the point of reflection. In one variant, the resistor $R_S$ is eliminated.

The values of the resistors $R_P$ and $R_S$ are determined empirically, either using charts or automatically. They depend on the parameters of the cable (impedance, attenuation, dispersion, speed of propagation) and are controllable.

For example, the values of the resistors $R_P$ and $R_S$ may be determined empirically by means of the following relationships. In the following part, it is assumed that the point of injection of the signal and the measurement point of the signal are identical. First of all, on the one hand, the amplitude A of the signal at the point of injection (called "amplitude of the injection peak") may be determined, and the amplitude B of the signal reflected on the load at the end of the cable (called "amplitude of the cable end peak") using the following relationships:

$$A = \frac{T_1 T_R}{1 - R_0 R_R}$$

$$B = A \frac{R_L T_2 T_R}{1 - R_0 R_R}$$

$T_1$ is the coefficient of transmission of the signal, at the point of injection, between the generator and the cable, $T_R$ is the coefficient of transmission of the signal, at the point of injection/measurement, between the generator and the receiver part R of the system, $T_2$ is the coefficient of transmission of the back-propagated signal, at the point of injection, of the cable toward the receiver part R of the system, $R_R$ is the coefficient of reflection of the signal on the receiver part R of the system, $R_L$ is the coefficient of reflection of the signal on the load at the end of the cable, $R_0$ is the coefficient of reflection of the signal coming from the receiver part R of the system, on the measurement point.

Those skilled in the art will know how to adapt the preceding equations to other more or less complex configurations of the system, notably configurations for which the cable has several branches and junctions with several loads at the ends. Other parameters of the system may also be taken into account in the equations, in particular the parameters linked to the attenuation of the signal in the cable.

When the equalizer 904 is inserted into the system, the preceding relationships may be modified so as to end up with:

$$A = \frac{2Z_R}{Z_1 + Z_R + Y_P Z_R Z_1}$$

$$B = A \frac{Y_P Z_R Z_1 (R_{p1} + R_{p2})}{Z_1 + Z_R + Y_P Z_R Z_1}$$

$Z_R$ is the impedance of the receiver part R of the system, $Z_1$ is the impedance of the track which connects the emission part E of the system to the equalizer 904, $Z_2$ is the impedance of the track which connects the receiver part R of the system to the equalizer 904, $Y_P$, $R_{P1}$ and $R_{P2}$ are intermediate variables which depend on coefficients $A_{ps}$, $B_{ps}$, $C_{ps}$, $D_{ps}$, which themselves depend on the resistors $R_s$ and $R_p$ of the equalizer 904.

Thus, the condition for the amplitudes A and B to be equal is given by the relationship:

$$Y_P(R_{p1} + R_{p2} - 1) = \frac{Z_R + Z_1}{Z_R Z_1} \qquad (1)$$

Using the equation (1), by fixing the various parameters of the system, the values of the resistors $R_s$ and $R_p$ of the equalizer 904 may be accordingly deduced.

Figure 17:
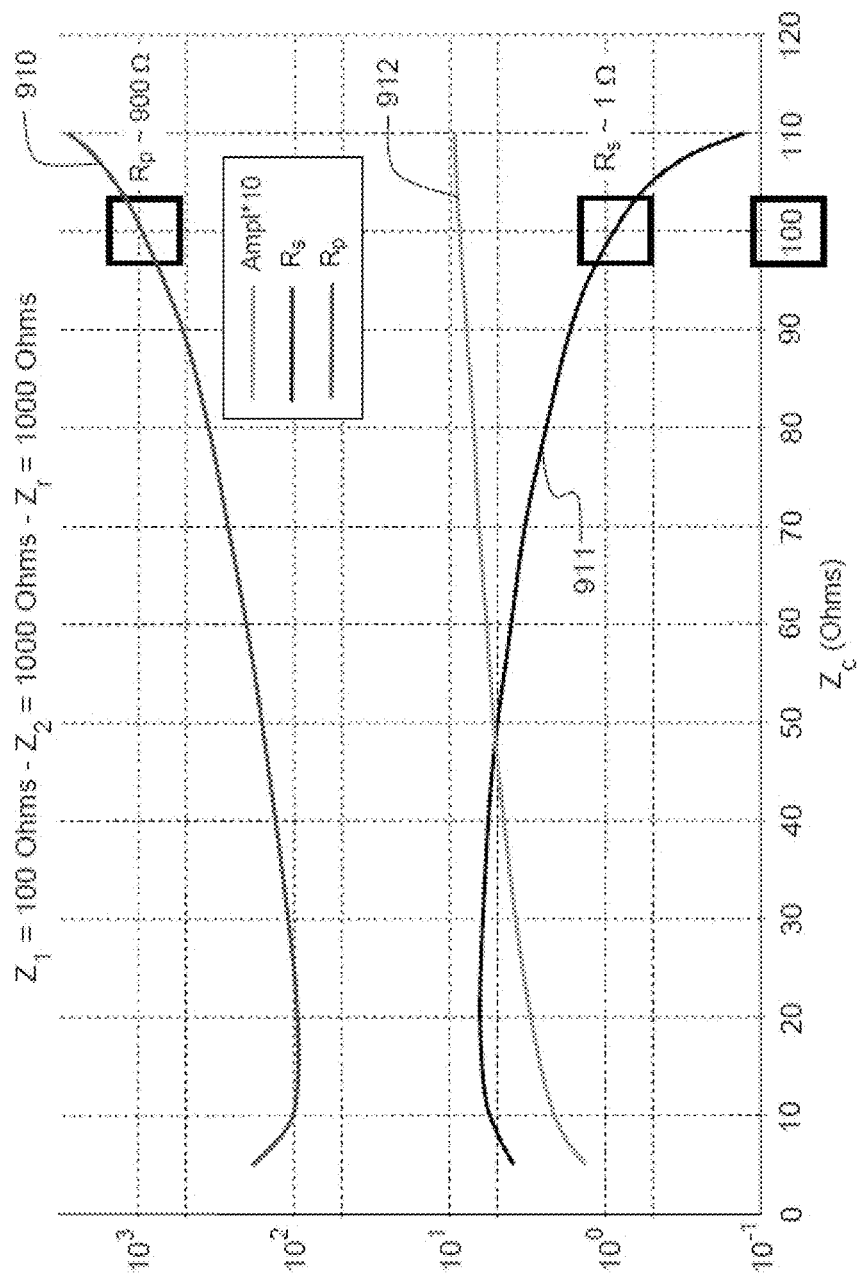

FIG. 17 illustrates, on a diagram, one example of a method for determining the values of the resistors $R_s$ and $R_p$ of the equalizer 904 using charts. For this example, the values of the impedances of the system are fixed at the values $Z_1$=100 Ohms, $Z_2$=1000 Ohms and $Z_R$=1000 Ohms. The curve 910 represents the value of the resistor $R_P$ as a function of the impedance $Z_C$ of the cable considering that the cable is terminated by a short-circuit. The curve 911 shows the value of the resistor $R_S$ as a function of the impedance $Z_C$ of the cable. The curve 912 shows the equal value of the amplitudes of the two peaks as a function of the impedance $Z_C$ of the cable.

Using the diagram in FIG. 17, the optimum values of the resistors $R_s$ and $R_p$ may thus be determined from the value of the impedance $Z_C$ of the cable.

Tolerance ranges around the optimum values of the resistors $R_s$ and $R_p$ may be envisioned in order to broaden the strict equality of the amplitudes of the two peaks to minimal differences between the two amplitudes. These tolerance ranges are notably determined as a function of the minimum amplitude of a peak corresponding to a soft fault that it is desired to be able to detect.

Figure 18:
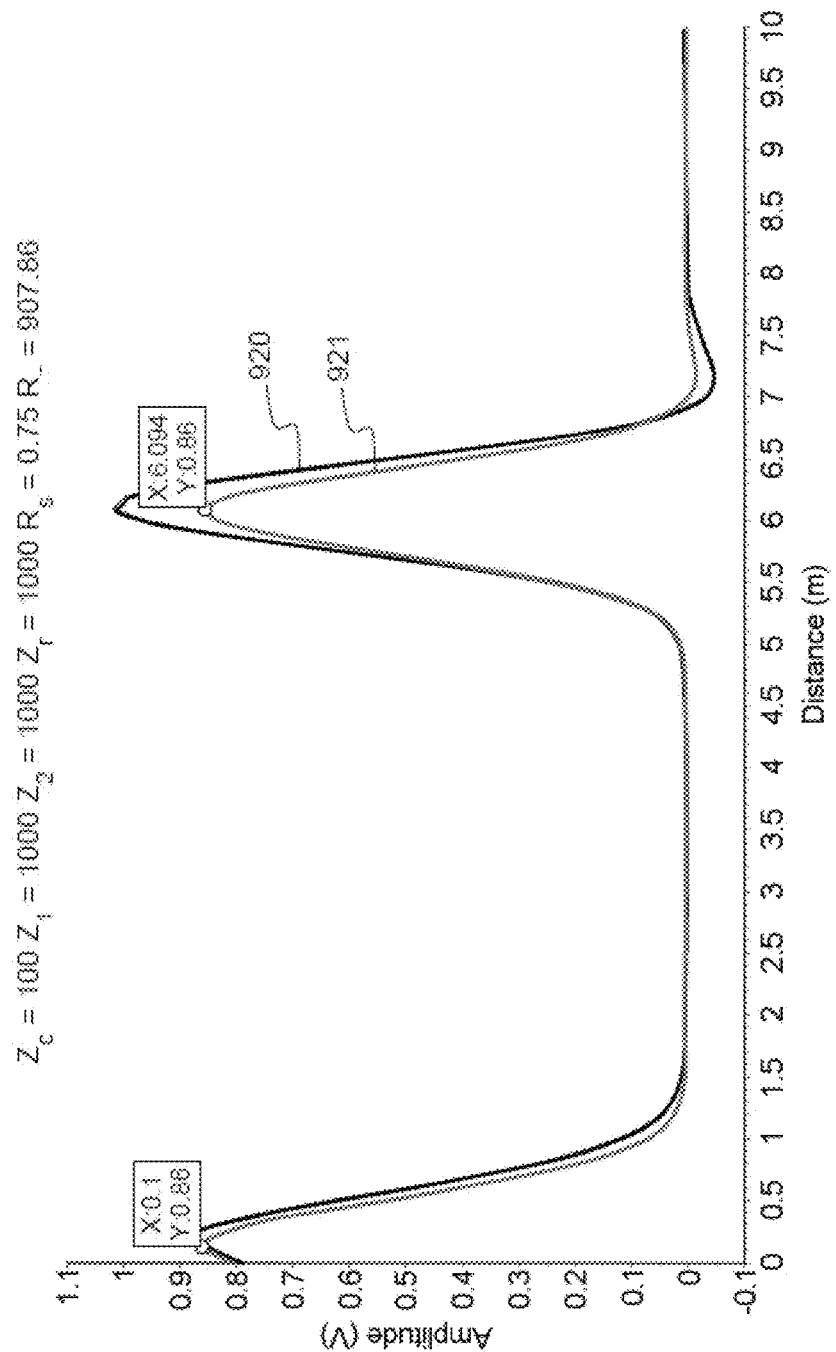

FIG. 18 illustrates the results obtained with the fourth embodiment of the invention. The reflectogram 920 is obtained without the equalizer 904 and exhibits two different amplitude peaks. The reflectogram 921 is obtained for the same cable by introducing the equalizer 904 with resistors Rs=0.75 Ohms and Rp=907.86 Ohms and exhibits two identical amplitude peaks.

Advantageously, the resistors of the equalizer 904 are programmable in order to adapt the system to the type of cable being tested.

The values of the resistors $R_s$ and $R_p$ may also be obtained automatically, in a phase for calibration of the system, by measuring the amplitudes of the two peaks of the reflectogram and by progressively adjusting the values of the resistors according to a closed-loop operation.

The determination of the values of the resistors $R_s$ and $R_p$ may also be made semi-analytically by calculating empirically a range of possible values for the resistors $R_s$ and $R_p$ as a function of the parameters of the system then by adjusting these values by analysis of the reflectogram, similarly to the calibration phase above-mentioned.

Without straying from the framework of the invention, the voltage divider bridge may be replaced by any equivalent device capable of performing the same equalization function.

In another variant embodiment, several equalizers may be used instead of a single equalizer 904.

The equalizer or equalizers may also be disposed between the tracks of the printed circuit connecting the transmission line to the injection or measurement device.

REFERENCES

[1] "Analysis of spread spectrum time domain reflectometry for wire fault location", P. Smith; C. Furse; J. Gunther, IEEE Sensors Journal, Year: 2005, Volume: 5, Issue: 6, Pages: 1469-1478
[2] "On line wire diagnosis using Multicarrier Time Domain Reflectometry for fault location", A. Lelong and M. Olivas Carrion, IEEE Sensors Conference, Christchurch, New Zealand, 2009, pp. 751-754
[3] "OMTDR using BER estimation for ambiguities cancellation in ramified networks diagnosis", Wafa Ben Hassen; Fabrice Auzanneau; Luca Incarbone; François Pérès; Ayeley P. Tchangani, 2013 IEEE Eighth International Conference on Intelligent Sensors, Sensor Networks and Information Processing
[4] "Chaos Time Domain Reflectometry for Online Defect Detection in Noisy Wired Networks", Fabrice Auzanneau; Nicolas Ravot; Luca Incarbone, IEEE Sensors Journal, Year: 2016, Volume: 16, Issue: 22, Pages: 8027-8034

The invention claimed is:

1. A reflectometry system for analyzing faults in a transmission line, a binarized reference signal being generated, in an initial step, and injected into the transmission line, the system comprising:
an acquisition device (CPL) for acquiring a back-propagated analog signal in the transmission line,
a binarization device (B) for quantizing said back-propagated analog signal into a signal digitized over two quantization levels,
a correlator (COR) configured for correlating the digitized signal with the binarized reference signal in order to produce a time-domain reflectogram,
a module for analyzing the time-domain reflectogram in order to identify a presence of faults in the transmission line,
wherein the correlator (COR) comprises at least one logic circuit implementing an Exclusive NOR logic gate (XNOR); and
wherein the correlator (COR) comprises several Exclusive NOR logic gates each arranged for receiving on their inputs a sample of the digitized signal and a sample of the reference signal, a summer (SOM) for summing outputs of the Exclusive NOR logic gates, a multiplier for multiplying an output of the summer (SOM) by two and an adder (ADD) for adding a predetermined number to a result from the summer (SOM).

2. The reflectometry system as claimed in claim 1, wherein the binarization device (B) is a logic circuit of the flip-flop or comparator type.

3. The reflectometry system as claimed in claim 1, comprising:
a generator (GEN) of the binarized reference signal,
an injection device (CPL) for injecting the binarized reference signal into the transmission line.

4. The reflectometry system as claimed in claim 3, wherein the generator (GEN) and the injection device (CPL) are implemented in the form of a programmable digital circuit having at least one digital output pin able to be connected to the transmission line.

5. The reflectometry system as claimed in claim 4, comprising a device for matching the impedance of the digital output pin to the impedance of the transmission line.

6. The reflectometry system as claimed in claim 3, furthermore comprising at least one equalizer disposed between the acquisition device (CPL) and a point of connection between said system and the transmission line, each equalizer being configured for equalizing the amplitudes obtained on the time-domain reflectogram for the respective peaks of the injected signal after its point of injection into the transmission line and of the signal reflected on the end of the transmission line.

7. The reflectometry system as claimed in claim 6, wherein an equalizer is formed by a voltage divider bridge comprising at least one resistor $R_P$.

8. The reflectometry system as claimed in claim 7, wherein an equalizer comprises two resistors $R_S$, $R_P$ arranged as a resistor bridge.

9. The reflectometry system as claimed in claim 7, wherein the values of the resistor $R_P$ or of the resistors $R_S$, $R_P$ are determined based on a set of impedances characterizing said system and the transmission line.

10. The reflectometry system as claimed in claim 1, wherein the reference signal is a binarized pseudo-random signal.

11. The reflectometry system as claimed in claim 1 wherein the correlator (COR) comprises a counter arranged for counting the number of values at 1 at the output of the Exclusive NOR logic gate, the correlator being configured for calculating the intercorrelation between the digitized signal and the reference signal using this number.

12. The reflectometry system as claimed in claim 1, furthermore comprising a white noise generator disposed between the acquisition device (CPL) and the binarization device (B).

13. The reflectometry system as claimed in claim 1, furthermore comprising a time derivative or differentiation device disposed upstream of the binarization device (B).

14. A reflectometry system for analyzing faults in a transmission line, a binarized reference signal being generated, in an initial step, and injected into the transmission line, the system comprising:

an acquisition device (CPL) for acquiring a back-propagated analog signal in the transmission line,
a binarization device (B) for quantizing said back-propagated analog signal into a signal digitized strictly over two quantization levels,
a correlator (COR) configured for correlating the digitized signal with the binarized reference signal in order to produce a time-domain reflectogram,
a module for analyzing the time-domain reflectogram in order to identify a presence of faults in the transmission line,
  wherein the correlator (COR) comprises at least one logic circuit implementing an Exclusive NOR logic gate (XNOR);
  wherein the correlator (COR) comprises at least one logic circuit implementing an Exclusive OR logic gate (XOR); and
  wherein the correlator (COR) is configured for incrementally calculating a time-domain reflectogram by means of the following steps:
  receive, at a current time i+dK, a measurement of the signal after its propagation in the transmission line, said measurement comprising a number dK of samples, determine a reflectogram $R_{i+dK}$ at the current time i+dK, starting from a preceding reflectogram $R_i$ calculated at a preceding time i, by carrying out the following operations for each value of the reflectogram:
    add to the preceding reflectogram $R_i$, a sum of the Exclusive OR operations between a number dK of samples of the measured signals at the preceding time i and a number dK of corresponding samples of the reference signals injected into the transmission line at an injection time i'–dK,
    add to the preceding reflectogram $R_i$, a sum of the Exclusive NOR operations between a number dK of samples measured at the current time i+dK and a number dK of corresponding samples of the reference signals injected into the transmission line at an injection time i'.

15. The reflectometry system as claimed in claim 14, wherein the correlator (COR) comprises a first shift register ($BUF_1$) for receiving the reference signal, the first shift register being respectively connected to a first input of the Exclusive OR logic gate (XOR) and to a first input of the Exclusive NOR logic gate (XNOR), a second shift register ($BUF_2$) for receiving the digitized signal, the second shift register being respectively connected to a second input of the Exclusive OR logic gate (XOR) and to a second input of the Exclusive NOR logic gate (XNOR), a register (BUF3) for saving the results of the calculation of a time-domain reflectogram, a first adder ($ADD_1$) arranged for adding a result produced at the output of the Exclusive OR logic gate (XOR) to a current value R(i) of the time-domain reflectogram, and a second adder ($ADD_2$) arranged for adding a result produced at the output of the Exclusive NOR logic gate (XNOR) to a current value R(i) of the time-domain reflectogram.

16. A reflectometry system for analyzing faults in a transmission line, a binarized reference signal being generated, in an initial step, and injected into the transmission line, the system comprising:
an acquisition device (CPL) for acquiring a back-propagated analog signal in the transmission line,
a binarization device (B) for quantizing said back-propagated analog signal into a signal digitized strictly over two quantization levels,
a correlator (COR) configured for correlating the digitized signal with the binarized reference signal in order to produce a time-domain reflectogram,
a module for analyzing the time-domain reflectogram in order to identify a presence of faults in the transmission line,
a time derivative or differentiation device disposed upstream of the binarization device (B), and
a digital time derivative or differentiation device applied to the reference signal before the correlation with the digitized signal.

* * * * *